US012632763B2

(12) United States Patent
Underwood et al.

(10) Patent No.: US 12,632,763 B2
(45) Date of Patent: May 19, 2026

(54) TIME-DOMAIN MULTIPLEXING OF QUANTUM BIT CONTROL SIGNALS

(71) Applicant: International Business Machines Corporation, Armonk, NY (US)

(72) Inventors: Devin Underwood, Bronx, NY (US); Sudipto Chakraborty, Plano, TX (US)

(73) Assignee: International Business Machines Corporation, Armonk, NY (US)

( * ) Notice: Subject to any disclaimer, the term of this patent is extended or adjusted under 35 U.S.C. 154(b) by 577 days.

(21) Appl. No.: 18/329,649

(22) Filed: Jun. 6, 2023

(65) Prior Publication Data

US 2024/0412089 A1 Dec. 12, 2024

(51) Int. Cl.
*G06N 10/40* (2022.01)
*H03K 3/38* (2006.01)
*H03M 1/66* (2006.01)

(52) U.S. Cl.
CPC .............. *G06N 10/40* (2022.01); *H03K 3/38* (2013.01); *H03M 1/66* (2013.01)

(58) Field of Classification Search
CPC ........ G06N 10/40; G06N 10/00; G06N 10/20; G06N 10/60; G06N 10/70; G06N 10/80; H03M 1/66; H03M 1/0604; H03M 1/12; H03K 3/38; G06F 9/30181; G06F 9/30134; H10D 48/383; G11C 27/024; H10N 60/12; H04N 10/70; H03D 7/1441
See application file for complete search history.

(56) References Cited

U.S. PATENT DOCUMENTS

| | | | |
|---|---|---|---|
| 10,063,228 B2 | 8/2018 | Deurloo et al. | |
| 10,454,459 B1 * | 10/2019 | Cohen ...................... | H03K 3/38 |
| 10,635,990 B1 * | 4/2020 | Park ...................... | G11C 27/024 |
| 10,659,018 B1 * | 5/2020 | Cohen ...................... | H03K 3/38 |
| 10,748,079 B2 | 8/2020 | Boothby | |
| 11,127,893 B2 | 9/2021 | Johnson et al. | |
| 11,238,360 B2 | 2/2022 | Bishop et al. | |
| 11,362,656 B1 | 6/2022 | Beck et al. | |
| 11,417,822 B2 | 8/2022 | Bronn et al. | |

(Continued)

FOREIGN PATENT DOCUMENTS

| | | | | |
|---|---|---|---|---|
| AU | 2020354489 B2 * | 10/2023 | ............. | G06N 10/40 |
| CA | 3162663 C * | 8/2005 | | |

(Continued)

OTHER PUBLICATIONS

A. Potocnik et al., "Millikelvin Temperature Cryo-CMOS Multiplexer for Scalable Quantum Device Characterisation," arXiv:2011. 11514v4, Sep. 14, 2021, 36 pages.

(Continued)

*Primary Examiner* — Steven P Sax

(74) *Attorney, Agent, or Firm* — Samuel Waldbaum; Ryan, Mason & Lewis, LLP

(57) ABSTRACT

A device comprises a control circuit configured to control a plurality of quantum bits. The control circuit comprises a digital-to-analog converter circuit and switching circuitry coupled to an output of the digital-to-analog converter circuit. The switching circuitry is responsive to switch control signals to selectively connect the output of the digital-to-analog converter circuit to one or more of a plurality of signal paths to generate control signals to control the plurality of quantum bits.

20 Claims, 18 Drawing Sheets

(56) References Cited

U.S. PATENT DOCUMENTS

| 11,727,297 | B2 * | 8/2023 | Stehlik | H10D 48/383 |
| | | | | 706/62 |
| 12,020,116 | B2 * | 6/2024 | Hoskinson | H10N 60/12 |
| 2018/0013426 | A1 * | 1/2018 | Deurloo | G06N 10/20 |
| 2018/0342663 | A1 * | 11/2018 | Ferguson | G06N 10/40 |
| 2019/0251478 | A1 * | 8/2019 | Bishop | G06F 17/16 |
| 2020/0371974 | A1 * | 11/2020 | Boothby | G06F 9/30134 |
| 2021/0175892 | A1 | 6/2021 | Mueller et al. | |
| 2022/0059919 | A1 | 2/2022 | Underwood et al. | |
| 2022/0207404 | A1 | 6/2022 | Boothby | |
| 2022/0236623 | A1 * | 7/2022 | Mukhanov | H03M 1/12 |
| 2022/0260860 | A1 | 8/2022 | Apisdorf et al. | |
| 2022/0374755 | A1 | 11/2022 | Didier | |
| 2022/0391738 | A1 * | 12/2022 | Subramanian | G06N 10/00 |
| 2022/0407460 | A1 * | 12/2022 | Chakraborty | H03D 7/1441 |
| 2023/0042521 | A1 * | 2/2023 | Cohen | G06F 9/30181 |
| 2023/0138924 | A1 * | 5/2023 | Pavlov | H03M 1/0604 |
| | | | | 341/119 |
| 2023/0401475 | A1 * | 12/2023 | Finck | H10N 60/128 |
| 2024/0127100 | A1 * | 4/2024 | Kannan | G06N 10/00 |
| 2024/0380412 | A1 * | 11/2024 | Ruehle | G06N 10/20 |

FOREIGN PATENT DOCUMENTS

| CA | 3101170 | A1 * | 3/2020 | G06N 10/00 |
| EP | 3192017 | B1 * | 11/2021 | G06N 10/40 |
| GB | 2609613 | A * | 2/2023 | G06N 10/40 |
| GB | 2627794 | A * | 9/2024 | G06N 10/40 |
| WO | WO-2008138150 | A1 * | 11/2008 | H03M 1/66 |
| WO | WO-2014028302 | A2 * | 2/2014 | H03K 19/166 |
| WO | WO-2021025738 | A2 * | 2/2021 | G06N 10/00 |
| WO | WO-2021223983 | A1 * | 11/2021 | G06N 10/40 |
| WO | WO-2023225738 | A1 * | 11/2023 | G06N 10/20 |
| WO | WO-2023249655 | A2 * | 12/2023 | H04B 10/70 |

OTHER PUBLICATIONS

S. Maurya et al., "COMPAQT: Compressed Waveform Memory Architecture for Scalable Qubit Control," arXiv:2212.03897v1, Dec. 7, 2022, 19 pages.

M. Ahmad et al., "Scalable Cryoelectronics for Superconducting Qubit Control and Readout," Advanced Intelligent Systems, May 26, 2022, 8 pages, vol. 4, No. 2.

W. D. Kalfus et al., "High-Fidelity Control of Superconducting Qubits Using Direct Microwave Synthesis in Higher Nyquist Zones," IEEE Transactions on Quantum Engineering, Dec. 8, 2020, 12 pages, vol. 1.

K. H. Park et al., "ICARUS-Q: Integrated Control and Readout Unit for Scalable Quantum Processors," arXiv:2112.02933v3, Sep. 2, 2022, 17 pages.

J. P. G. Van Dijk et al., "Designing a DDS-Based SoC for High-Fidelity Multi-Qubit Control," IEEE Transactions on Circuits and Systems I: Regular Papers, Dec. 2020, pp. 5380-5393, vol. 67, No. 12.

* cited by examiner

200

300

X-Stabilizer Circuit

410

Circuit Depth
(time)

Z-Stabilizer Circuit

420

Circuit Depth
(time)

Z-Stabilizer Measurement
630

730

<u>800</u>

(A) ANCILLA QUBIT (D) DATA QUBIT (B) FLUX-TUNABLE BUS

900

920

X-parity check

930

Z-parity check

1020

Frequency
(Hz)

TIME-DOMAIN MULTIPLEXING OF QUANTUM BIT CONTROL SIGNALS

BACKGROUND

This disclosure relates generally to superconducting quantum computing and, in particular, techniques for generating control signals for controlling superconducting quantum bits (qubits). A superconducting quantum computing system is implemented using superconducting qubits to generate and process quantum information. Various types of quantum information processing operations can be implemented using a superconducting quantum processor which comprises multiple superconducting qubits, wherein the superconducting qubits can be coherently controlled, placed into quantum superposition states (via, e.g., single-gate operations), exhibit quantum interference effects, and become entangled with one another (via, e.g., entanglement gate operations). Technological advances in quantum computing are driven, in part, by implementing high-performance control systems that are configured to generate control signals for controlling the operation of qubits (e.g., qubit state control signal, qubit readout control signals, flux-tuning control signals, etc.) and other superconducting devices that are used for quantum computing. For example, it is desirable for such control systems to have small footprints and low-power dissipation, while being able to generate high-fidelity qubit control signals for precise control and operation of a quantum processor.

SUMMARY

Exemplary embodiments of the disclosure include techniques for generating control signals to control quantum bits of, e.g., quantum processors. For example, an exemplary embodiment includes a device which comprises a control circuit configured to control a plurality of quantum bits. The control circuit comprises a digital-to-analog converter circuit and switching circuitry coupled to an output of the digital-to-analog converter circuit. The switching circuitry is responsive to switch control signals to selectively connect the output of the digital-to-analog converter circuit to one or more of a plurality of signal paths to generate control signals to control the plurality of quantum bits.

Another exemplary embodiment includes a device which comprises a control circuit configured to control a quantum bit array comprising quantum bits and flux-tunable couplers which control exchange interactions between adjacent quantum bits in the quantum bit array. The control circuit comprises one or more instances of a first control block which is configured to generate control signals to control a first flux-tunable coupler, a second flux-tunable coupler, and a quantum bit that is disposed between the first flux-tunable coupler and the second flux-tunable coupler in the quantum bit array. Each instance of the first control block comprises a digital-to-analog converter circuit, and switching circuitry coupled to an output of the digital-to-analog converter circuit. The switching circuitry is responsive to switch control signals to selectively couple the output of the digital-to-analog converter circuit to a given signal path, at a given time, to generate and apply a control signal to one of the first flux-tunable coupler, the second flux-tunable coupler, and the quantum bit disposed therebetween, at the given time.

Another exemplary embodiment includes a system which comprises a quantum processor and a control system. The quantum processor comprises a quantum bit array which comprises quantum bits and flux-tunable couplers that are configured to control exchange interactions between adjacent quantum bits in the quantum bit array. The control system comprises a control circuit which is configured to generate control signals to control the quantum processor. The control circuit comprises one or more instances of a first control block which is configured to generate control signals to control a first flux-tunable coupler, a second flux-tunable coupler, and a quantum bit that is disposed between the first flux-tunable coupler and the second flux-tunable coupler in the quantum bit array. Each instance of the first control block comprises a digital-to-analog converter circuit, and switching circuitry coupled to an output of the digital-to-analog converter circuit. The switching circuitry is responsive to switch control signals to selectively couple the output of the digital-to-analog converter circuit to a given signal path, at a given time, to generate and apply a control signal to one of the first flux-tunable coupler, the second flux-tunable coupler, and the quantum bit disposed therebetween, at the given time.

Other embodiments will be described in the following detailed description of exemplary embodiments, which is to be read in conjunction with the accompanying figures.

DETAILED DESCRIPTION

Figure 1:
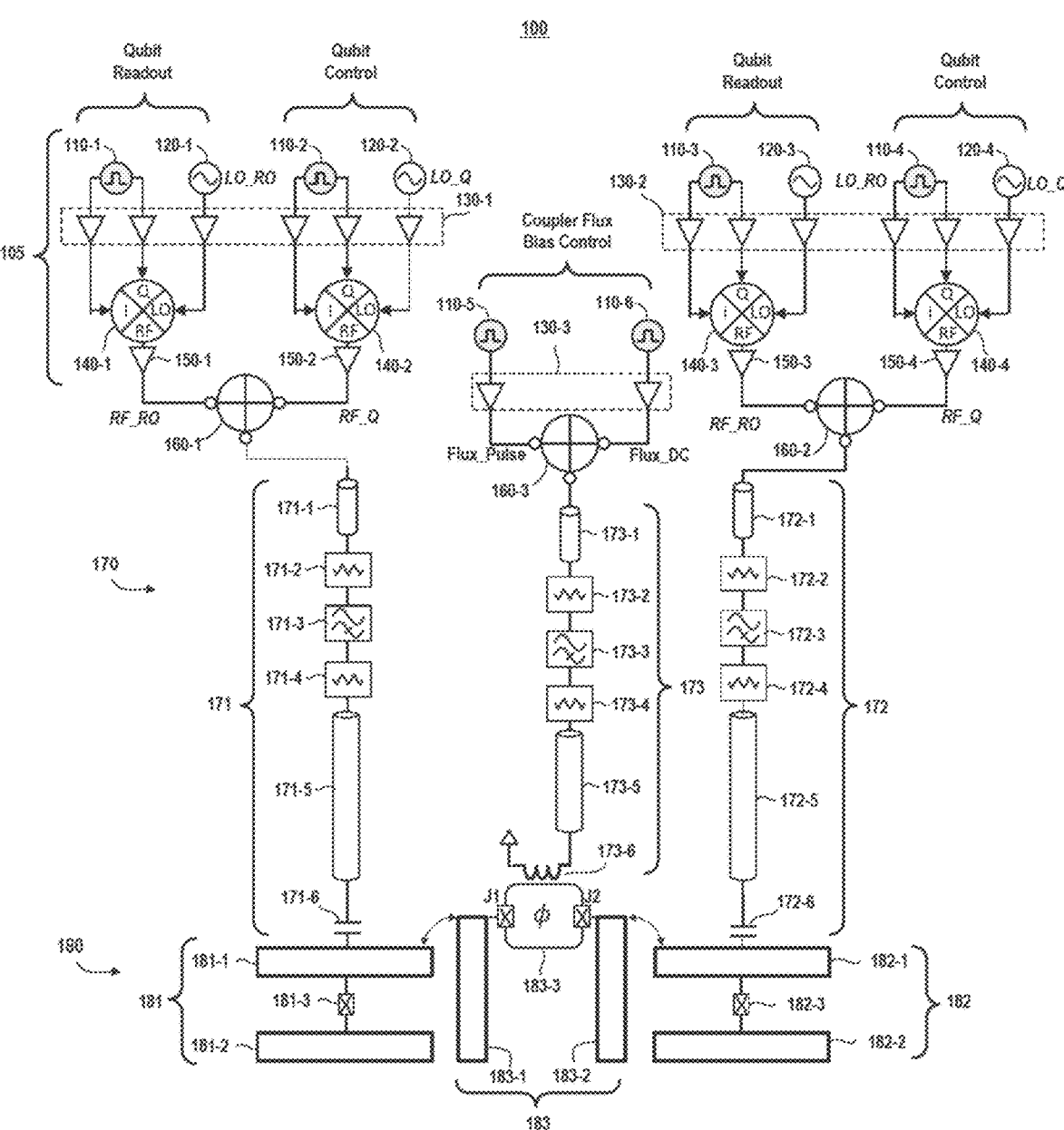
FIG. 1 schematically illustrates a quantum computing system according to an exemplary embodiment of the disclosure.

Exemplary embodiments of the disclosure will now be described in further detail with regard to quantum computing systems which comprise control systems that implement time domain multiplexing of control signals for controlling a quantum bit arrays of superconducting quantum processors. It is to be understood that the various features shown in the accompanying drawings are schematic illustrations that are not drawn to scale. Moreover, the same or similar reference numbers are used throughout the drawings to denote the same or similar features, elements, or structures, and thus, a detailed explanation of the same or similar features, elements, or structures will not be repeated for each of the drawings. Further, the term "exemplary" as used herein means "serving as an example, instance, or illustration." Any embodiment or design described herein as "exemplary" is not to be construed as preferred or advantageous over other embodiments or designs.

Further, it is to be understood that the phrase "configured to" as used in conjunction with a circuit, structure, element, component, or the like, performing one or more functions or otherwise providing some functionality, is intended to encompass embodiments wherein the circuit, structure, element, component, or the like, is implemented in hardware, software, and/or combinations thereof, and in implementations that comprise hardware, wherein the hardware may comprise quantum circuit elements (e.g., quantum bits, coupler circuitry, etc.), discrete circuit elements (e.g., transistors, inverters, etc.), programmable elements (e.g., application specific integrated circuit (ASIC) chips, field-programmable gate array (FPGA) chips, etc.), processing devices (e.g., central processing units (CPUs), graphics processing units (GPUs), etc.), one or more integrated circuits, and/or combinations thereof. Thus, by way of example only, when a circuit, structure, element, component, etc., is defined to be configured to provide a specific functionality, it is intended to cover, but not be limited to, embodiments where the circuit, structure, element, component, etc., is comprised of elements, processing devices, and/or integrated circuits that enable it to perform the specific functionality when in an operational state (e.g., connected or otherwise deployed in a system, powered on, receiving an input, and/or producing an output), as well as cover embodiments when the circuit, structure, element, component, etc., is in a non-operational state (e.g., not connected nor otherwise deployed in a system, not powered on, not receiving an input, and/or not producing an output) or in a partial operational state.

As is known in the art, quantum computing provides a computing paradigm which utilizes fundamental principles of quantum mechanics to perform computations. Quantum computing algorithms and applications are defined using quantum circuits. A quantum circuit is a computational routine which defines coherent quantum operations that are performed on quantum data that is stored in quantum bits, in conjunction with operations that are performed using classical computation. Quantum circuits are utilized to define complex algorithms and applications in an abstract manner, which can be executed on a quantum computer. In a quantum computer, primitive operations comprise gate operations (e.g., single-qubit gate operations, two-qubit gate operations, multi-qubit gate operations (e.g., 3 or more qubits) that are applied to qubits, to perform quantum computing operations for a given application. The quantum circuits allow a quantum computer to receive classical data, perform quantum operations based on the received data, and output a classical solution.

A single qubit can have a basis state of $|0\rangle$ or $|1\rangle$, or a linear combination of such basis states, which is known as a superposition state. As is known in the art, the state of a qubit can be graphically represented as a point on unit sphere (radius=1), which is called the Bloch sphere, with X, Y, and Z axes. The basis state $|0\rangle$ (referred to as ground state) of a qubit is represented at a point (north pole) on a positive Z-axis of the Bloch sphere, while the basis state or $|1\rangle$ (referred to as first excited state) of a qubit is represented at a point (south pole) on a negative Z-axis of the Bloch sphere. A superposition state $|\psi\rangle$ of the qubit can be represented as a point on the Bloch sphere as follows:

$$|\psi\rangle = \cos\frac{\theta}{2}|0\rangle + e^{i\phi}\sin\frac{\theta}{2}|1\rangle,$$

where the terms $$\cos\frac{\theta}{2} \text{ and } \sin\frac{\theta}{2}$$

correspond to the amplitude probabilities associated with the respective states $|0\rangle$ and $|1\rangle$, and wherein the term $e^{i\phi}$ corresponds to a relative phase between the states $|0\rangle$ and $|1\rangle$. The position of a point on the Bloch sphere representing a superposition state of a qubit is determined based on the angles $\theta$ and $\phi$. The angle $\theta$ influences the probability of observing a qubit state of $|0\rangle$ or $|1\rangle$ when the qubit is read, wherein the probability of reading a qubit state of $|1\rangle$ increases as $\theta$ increases. The angle $\phi$ influences the relative phase between the states $|0\rangle$ and $|1\rangle$. For example, when $\theta=0$, the qubit is in the ground state $[0\rangle$, which provides a 100% probability of observing a qubit state of $|0\rangle$ when the qubit state is read. In addition, when $\theta=\pi$, the qubit is in the first excited state $|1\rangle$, which provides a 100% probability of observing a qubit state of $|1\rangle$ when the qubit state is read. On the other hand, when $$\theta = \frac{\pi}{2} \text{ and } \phi = 0,$$

the qubit is in a state at point on the positive X-axis of the Bloch sphere, and when $$\theta = \frac{\pi}{2} \text{ and } \phi = \frac{\pi}{2},$$

the qubit is in a state at a point on the positive Y-axis of the Bloch sphere.

The state of a given qubit can be changed by applying a single-qubit gate operation to the given qubit, which causes the current state of the qubit to rotate around, e.g., the X-axis, Y-axis, and/or Z-axis, etc., depending on the given gate operation. A rotation about the Z-axis results in a change in the angle $\phi$. In addition, qubits can be controlled using entanglement gate operations to entangle the states of two or more qubits and, thereby, generate a combined state of two or more qubits, which contains more information than the individual states of the qubits. In this regard, entanglement allows multiple qubits in a superposition to be correlated with each other in a way that the state of one qubit can depend on the state of another qubit such that more information can be encoded with multiple entangled qubits as compared to encoding the qubits individually. Accordingly, quantum information processing, based on principles of superposition and entanglement stage of qubits, allows quantum computers to solve difficult problems that are intractable using conventional computers.

FIG. 1 schematically illustrates a quantum computing system 100 according to an exemplary embodiment of the disclosure. The quantum computing system 100 comprises control signal generator circuitry 105 (e.g., a multi-channel arbitrary waveform generator (AWG)) which comprises a plurality of digital-to-analog converter (DAC) circuits 110-1, 110-2, 110-3, 110-4, 110-5, and 110-6, a plurality of local oscillator (LO) signal generators 120-1, 120-2, 120-3, and 120-4, a plurality of driver/buffer circuits 130-1, 130-2, and 130-3, a plurality of mixer circuits 140-1, 140-2, 140-3, and 140-4, and amplifiers 150-1, 150-2, 150-2, and 150-4. The quantum computing system 100 further comprises a plurality of signal combiner circuits 160-1, 160-2, and 160-3, a plurality of signal chains 170, and a plurality of superconducting quantum devices 180.

The plurality of signal chains 170 include a first signal chain 171, a second signal chain 172, and a third signal chain 173. The first signal chain 171 comprises transmission lines 171-1 and 171-5 (which represent, e.g., coaxial cables, planar (printed) transmission lines, etc.), signal attenuators 171-2 and 171-4, a high-pass filter 171-3, and a capacitor 171-6 which represents a qubit drive line that is capacitively coupled to the first superconducting qubit 181. Similarly, the second signal chain 172 comprises transmission lines 172-1 and 172-5 (which represent, e.g., coaxial cables, planar (printed) transmission lines, etc.), signal attenuators 172-2 and 172-4, a high-pass filter 172-3, and a capacitor 172-6 which represents a qubit drive line that is capacitively coupled to the second superconducting qubit 182. The third signal chain 173 comprises transmission lines 173-1 and 173-5 (which represent, e.g., coaxial cables, planar (printed) transmission lines, etc.), signal attenuators 173-2 and 173-4, a high-pass filter 173-3, and an inductor 173-6 which represents a flux-bias line that that enables inductive coupling of flux bias control signals to the superconducting flux-tunable coupler 183.

The plurality of superconducting quantum devices 180 include a first superconducting qubit 181, a second superconducting qubit 182, and a superconducting flux-tunable coupler 183 (or flux-tunable bus). In some embodiments such as shown in FIG. 1, the first and second superconducting qubits 181 and 182 each comprise a superconducting transmon qubit. A superconducting transmon qubit is a type of superconducting qubit which comprises a superconducting Josephson junction connected in parallel with a capacitor. FIG. 1 shows an exemplary planar circuit configuration for each superconducting qubit 181 and 182. The first superconducting qubit 181 comprises a first superconducting pad 181-1, a second superconducting pad 181-2, and a Josephson junction 181-3 that is coupled to, and disposed between, the first and second superconducting pads 181-1 and 181-2. The first and second superconducting pads 181-1 and 181-2 comprise electrodes of a coplanar parallel-plate capacitor structure of the transmon qubit. The Josephson junction 181-3 has a Josephson energy $E_J$ and critical current $I_C$. The Josephson junction 181-3 functions as a non-linear inductor which, when shunted with the capacitor formed by the first and second superconducting pads 181-1 and 181-2, forms an anharmonic LC oscillator with individually addressable energy levels (e.g., two lowest energy level corresponding to the ground state $|0\rangle$ and the first excited state $|1\rangle$).

Similarly, the second superconducting qubit 182 comprises a first superconducting pad 182-1, a second superconducting pad 182-2, and a Josephson junction 182-3 that is coupled to, and disposed between, the first and second superconducting pads 182-1 and 182-2. In the exemplary embodiment, the first and second superconducting qubits 181 and 182 are fixed frequency qubits having fixed transition frequencies that are determined based primarily on a charging energy $(E_c)$ and a Josephson energy $E_J$ of the Josephson junctions, as is well known to those of ordinary skill in the art.

The first and second superconducting qubits 181 and 182 are capacitively coupled to the superconducting flux-tunable coupler 183. The superconducting flux-tunable coupler 183 (alternatively, flux-tunable bus) serves to couple the adjacent superconducting qubits 181 and 182 and modulate exchange interaction between the first and second superconducting qubits 181 and 182. In some embodiments, the superconducting flux-tunable coupler 183 comprises a transmon qubit coupler having a flux-tunable operating frequency. The superconducting flux-tunable coupler 183 is similar to the first and second superconducting qubits 181 and 182 in that the superconducting flux-tunable coupler 183 comprises a first superconducting pad 183-1 and a second superconducting pad 183-2, which form a parallel-plate capacitor of the transmon qubit coupler. However, the superconducting flux-tunable coupler 183 is configured to be flux-tunable by implementing a superconducting quantum interference device (SQUID) 183-3, which is coupled to and between the first and second superconducting pads 183-1 and 183-2. The SQUID 183-3 comprises a first Josephson junction J1 and a second Josephson junction J2, which are connected in parallel to form a superconducting loop (referred to as SQUID loop) through which an external magnetic flux $\phi$ can be threaded to control the interaction (e.g., facilitate exchange interaction or suppress crosstalk) between the first and second superconducting qubits 181 and 182 that are a coupled through the superconducting flux-tunable coupler 183.

For example, in some embodiments, the superconducting flux-tunable coupler 183 can be flux-tuned to operate in a first state (e.g., "OFF" state or "deactivated" state) or a second state (e.g., "ON" state or "activated" state) by changing an amount of external magnetic flux that is applied to the superconducting loop of the SQUID 183-3. In the "OFF" state, the superconducting flux-tunable coupler 183 essentially decouples the first and second superconducting qubits 181 and 182 which serves to suppress exchange interaction (static or otherwise) between the first and second superconducting qubits 181 and 182. In some embodiments, as explained in further detail below, the superconducting flux-tunable coupler 183 is maintained in an OFF state by applying a DC flux bias signal (DC current) to the superconducting flux-tunable coupler 183. On the other hand, the "ON" state of the superconducting flux-tunable coupler 183 enables the first and second superconducting qubits 181 and 182 to be exchanged coupled with the superconducting flux-tunable coupler 183 which, in turn, enables/facilitates exchange coupling (e.g., ZZ interaction) between the first and second superconducting qubits 181 and 182 that are capacitively coupled to the superconducting flux-tunable coupler 183. In some embodiments, as explained in further detail below, the superconducting flux-tunable coupler 183 is placed into an ON state by applying a pulse flux bias signal (on top of the DC flux bias signal) to the superconducting flux-tunable coupler 183 to enable a controlled amount of exchange interaction (entanglement) between the states of the first and second superconducting qubits 181 and 182.

The control signal generator circuitry 105 is configured to (i) generate RF control pulses to control the operation (state change and readout) of the first and second superconducting qubits 181 and 182, and (ii) generate flux bias control signals (e.g., DC flux bias signal and pulse flux bias signals) to control operation of the superconducting flux-tunable coupler 183, when performing various gate operations to execute a given quantum information processing algorithm. In some embodiments, the control signal generator circuitry 105 implements a quadrature AWG system which is configured to generate quadrature signals, wherein a quadrature signal comprises an in-phase (I) signal component, and a quadrature-phase (Q) signal component. The DAC circuits 110-1, 110-2, 110-3, and 110-4 are configured to convert digital I and Q signals into analog signals I(t) and Q(t) which are applied to the respective mixer circuits 140-1, 140-2, 140-3, and 140-4 along with LO signals (LO_RO and LO_Q) that are generated by the respective LO signal generators 120-1, 120-2, 120-3, and 120-4 to generate to generate RF control pulses for qubit control and qubit readout operations.

More specifically, as shown in FIG. 1, the DAC circuit 110-1 and the mixer circuit 140-1 operate in conjunction to generate an RF readout control signal (RF_RO) which is coupled to the first signal chain 171 through the signal combiner circuit 160-1, and applied (via capacitive coupling) to the first superconducting qubit 181 to initiate a readout operation to readout a state of the first superconducting qubit 181. In this instance, the DAC circuit 110-1 is configured to generate analog I and Q control pulses of a first type (e.g., Gaussian square pulses), and the mixer circuit 140-1 is configured to mix the I and Q control pulses with an LO signal (LO_RO) of a given LO frequency to perform I/Q modulation and upconversion using known techniques to generate the RF readout control pulse (RF_RO).

Further, the DAC circuit 110-2 and the mixer circuit 140-2 operate in conjunction to generate an RF qubit control signal (RF_Q) which is coupled to the first signal chain 171 through the signal combiner circuit 160-1 and applied (via capacitive coupling) to the first superconducting qubit 181 to change a state of the first superconducting qubit 181. In this instance, the DAC circuit 110-2 is configured to generate analog I and Q control pulses of a second type (e.g., Gaussian pulses), and the mixer circuit 140-2 is configured to mix the analog I and Q control pulses with an LO signal (LO_Q) of a given LO frequency to perform I/Q modulation and upconversion using known techniques to generate the RF qubit control signal (RF_Q).

In a similar manner, the DAC circuit 110-3 is configured to generate analog I and Q control pulses of the first type (e.g., Gaussian square pulses), and the mixer circuit 140-3 is configured to mix the I and Q control pulses with an LO signal (LO_RO) of a given LO frequency to perform I/Q modulation and upconversion to generate the RF readout control pulse (RF_RO), which is coupled to the second signal chain 172 through the signal combiner circuit 160-2, and applied (via capacitive coupling) to the second superconducting qubit 182 to initiate a readout operation to readout a state of the second superconducting qubit 182. Further, in a similar manner, the DAC circuit 110-4 is configured to generate analog I and Q control pulses of the second type (e.g., Gaussian pulses), and the mixer circuit 140-4 is configured to mix the analog I and Q control pulses with an LO signal (LO_Q) of a given LO frequency to perform I/Q modulation and upconversion to generate the RF qubit control signal (RF_Q), which is coupled to the second signal chain 172 through the signal combiner circuit 160-2, and applied (via capacitive coupling) to the second superconducting qubit 182 to change a state of the second superconducting qubit 182.

It is to be noted that the RF qubit control signals (RF_Q) for the first and second superconducting qubits 181 and 181 comprise RF control pulses which have center frequencies equal to the transition frequencies (denoted for) of the respective first and second superconducting qubits 181 and 182, wherein the transition frequency $f_{01}$ corresponds to an energy difference between the ground state $|0\rangle$ and excited state $|1\rangle$ of the qubit. The RF qubit control signals (RF_Q) comprise shaped control pulses that are calibrated to drive $f_{01}$ transitions of the qubits, while suppressing $f_{12}$ and higher transitions. The RF qubit control signals (RF_Q) are applied to the first and second superconducting qubits 181 and 182 to independently change the states of such qubits to perform single-qubit gate operations on the first and second superconducting qubits 181 and 182 or otherwise modify the computational state of the first and second superconducting qubits 181 and 182 as needed when executing quantum algorithms (e.g., syndrome measurements for quantum error correction). The RF qubit control signals (RF_Q) are configured to change the state of a given qubit by rotating the state of the given qubit about an axis in the Bloch sphere, wherein such rotations include X-axis rotations, Y-axis rotations, and/or rotations about any axis in the X-Y plane of the Bloch sphere, wherein the axis of rotation about a given axis of the Bloch sphere and the amount (angle) of such rotation are based, respectively, on the phase of the microwave control signal, and the amplitude and duration of the microwave control signal.

It is to be further noted that in some embodiments, the RF readout control signals (RF_RO) comprise RF control pulses with center frequencies which correspond to the resonant frequencies of readout resonators that are coupled to the qubits, wherein the resonant frequencies of such readout resonators are detuned from the transition frequencies of the qubits. In some embodiments, the readout resonators comprise, e.g., half-wavelength coplanar waveguide resonators, which are utilized to readout the quantum states of the respective superconducting qubits 181 and 182 using, e.g., dispersive readout systems and techniques, which are well-known to those of ordinary skill in the art.

In some embodiments, a dispersive readout operation for reading the quantum state of a given superconducting qubit which is coupled to a given readout resonator, is performed by applying an RF readout control signal (RF_RO) to the given readout resonator, and detecting/processing the readout signal that is reflected out from the given readout resonator. As noted above, RF readout control signal that is applied to the given readout resonator has a single frequency tone that is the same or similar to the resonant frequency of the readout resonator, a pulse envelope with a given pulse shape (e.g., gaussian pulse envelope), and given pulse duration. In the dispersive regime of qubit-resonator coupling, the RF readout control signal (RF_RO) interacts with the given qubit/resonator system, and the resulting output readout signal which is reflected out from the given readout resonator comprises information (e.g., phase and/or amplitude) that is qubit-state dependent. For case of illustration, FIG. 1 does not illustrate the readout resonator or readout signal chains which transmit the readout signal to readout processing circuitry.

The DAC circuit 110-6 is configured to generate a DC flux bias signal (Flux_DC) which comprises a DC current signal that is fed by the third signal chain 173 to the inductor 173-6 which is disposed adjacent to the superconducting loop of the SQUID 183-3 of the superconducting flux-tunable coupler 183. The DC flux bias signal (Flux_DC) causes an external static magnetic field @ to be generated and applied to the superconducting loop of the SQUID 183-3. The external static magnetic field @ modulates the critical current, and thus, the Josephson energy of the SQUID 183-3 in a manner which causes the superconducting flux-tunable coupler 183 to be maintained in an OFF state which, as noted above, suppresses exchange interactions between the first and second superconducting qubits 181 and 182.

On the other hand, the DAC circuit 110-5 is configured to generate a flux bias control signal (Flux_Pulse) to temporarily place the superconducting flux-tunable coupler 183 into an ON state, when needed, to modulate an exchange interaction between the first and second superconducting qubits 181 and 182. In this instance, the signal combiner circuit 160-3 combines the flux bias control signal (Flux_Pulse) with the DC flux bias signal (Flux_DC) to dynamically increase the flux bias current through the inductor 173-6 and thereby change the external magnetic field @ that is applied to the superconducting loop of the SQUID 183-3, and thereby place the superconducting flux-tunable coupler 183 into an ON state for a duration of the flux bias control signal (Flux_Pulse). The DAC circuit 110-5 is configured to generate a control pulse of a third type (e.g., Raman pulse) which is used to generate the flux bias control signal (Flux_Pulse) to activate the superconducting flux-tunable coupler 183.

While FIG. 1 depicts a quantum system comprising two superconducting qubits 181 and 182, a superconducting flux-tunable coupler 183 to control the exchange interaction between the two superconducting qubits 181 and 182, the complexity and hardware overhead associated with the control signal generation circuit architecture for a quantum processor increases as the number of qubits and flux-tunable couplers implemented in the quantum processor increases. For example, based on the exemplary control system architecture shown in FIG. 1, each qubit would need two DAC circuits-one DAC for qubit control pulses and one DAC for qubit readout pulses. In addition, each flux-tunable coupler would need two DAC circuits-a DC offset DAC and a flux pulsing DAC. In this regard, a relatively large superconducting qubit array with flux-tunable couplers would require a signal generation system architecture with a relatively large footprint and high-power dissipation. When developing CMOS ASICs for control signal generation, however, it is desirable to limit the number of circuit components, such as DACs and other components, to reduce the chip area and minimize power dissipation.

To minimize control system complexity/overhead and reduce power dissipation, exemplary control signal generation systems according to exemplary embodiments of the disclosure utilize hardware efficient control circuit architectures to generate control signals (e.g., qubit control/readout signals, and flux-bias control signals) in conjunction with a time domain multiplexing control scheme to enable sharing of various components of the control circuitry between multiple quantum devices which are operated using control signals generated by the shared control circuitry. As explained in further detail below, the exemplary time domain multiplexing techniques and shared control circuit architectures as discussed herein reduce the number of circuit components (e.g., DACs, filters, etc.) for implementing a control signal generation system to control a qubit array with flux-tunable couplers and, thus, enable a smaller footprint CMOS ASIC for control signal generation with reduced power dissipation.

Figure 2:
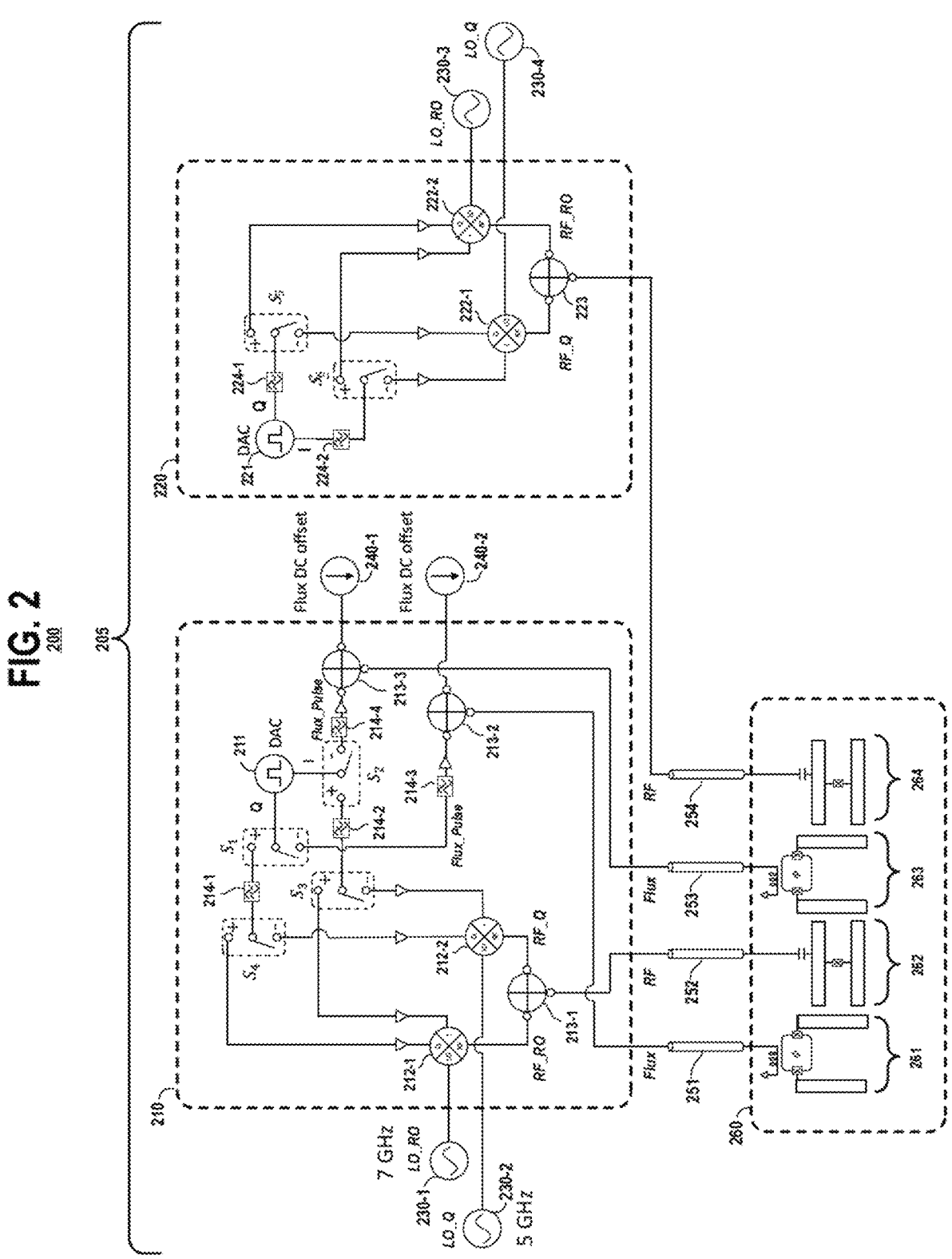
FIG. 2 schematically illustrates a quantum computing system comprising a control system which implements time domain multiplexing of control signals for controlling a superconducting quantum processor, according to an exemplary embodiment of the disclosure.

FIG. 2 schematically illustrates a quantum computing system comprising a control system which implements time domain multiplexing of control signals for controlling a superconducting quantum processor, according to an exemplary embodiment of the disclosure. More specifically, FIG. 2 schematically illustrates a quantum computing system 200 comprising a control system 205 which comprises a first control block 210, a second control block 220, a plurality of LO signal generators 230-1, 230-2, 230-3, and 230-4, and a plurality of DC current sources 240-1 and 240-2. In addition, the quantum computing system 200 comprises a plurality of signal chains 251, 252, 253, and 254, and a quantum processor 260 which comprises a plurality of superconducting quantum devices including a first flux-tunable coupler 261, a first qubit 262, a second flux-tunable coupler 263, and a second qubit 264.

The first control block 210 comprises a single DAC circuit 211, a plurality of switches S1, S2, S3, and S4, a plurality of I/Q mixers 212-1 and 212-2, a plurality of signal combiners 213-1, 213-2, and 213-3, and a plurality of filters 214-1, 214-2, 214-3, and 214-4. The second control block 220 comprises a single DAC circuit 221, a plurality of switches S5 and S6, a plurality of/Q mixers 222-1 and 222-2, a signal combiner 223, and a plurality of filters 224-1 and 224-2. In some embodiments, the switches S1, S2, S3, S4, S5, and S6 each comprise a single-pole double-throw (SPDT) switch circuit that is controlled by a respective switch control signal based on a time-domain multiplexing control protocol. As schematically illustrated in FIG. 2, each switch S1, S2, S3, S4, S5, and S6 comprises an input terminal, a first output terminal (denoted by +), and a second output terminal (denoted by –). The I/Q mixers 212-1, 212-2, 222-1, and 222-2 perform I/Q modulation and upconversion using techniques as discussed above. In some embodiments, the filters 214-1, 214-2, 214-3, 214-4, 224-1, and 224-2 each comprise a low pass filter. In some embodiments, the filters 214-1, 214-2, 214-3, 214-4, 224-1, and 224-2 are each implemented using an exemplary low-pass filter circuit architecture such as shown and described in further detail below in conjunction with FIGS. 10A and 10B.

The first and second control blocks 210 and 220 each comprise a single DAC circuit for generating different control signals, while utilizing the respective SPDT switch circuitry to enable time-domain multiplexing of control signals to route the different control signals, as needed, to operate the quantum devices of the quantum processor 260. For example, in the first control block 210, the single DAC circuit 211 is configured to generate I/Q signals which are utilized to generate (i) RF control signals, e.g., RF readout control signals (RF_RO) and RF qubit control signals (RF_Q), to control the first qubit 262, and (ii) flux pulse control signals (Flux_Pulse) to control the first and second flux-tunable couplers 261 and 263. In this configuration, the single DAC circuit 211 is configured to generate different basis functions (control pulse envelopes) for the control signals, e.g., a Gaussian pulse for qubit control, a Gaussian square pulse for a readout control signal, a Raman pulse for RF flux bias control, etc. Further, in the second control block 220, the single DAC circuit 221 is configured to generate I/Q signals which are utilized to generate RF readout control signals (RF_RO) and RF qubit control signals (RF_Q) to control the second qubit 264. In this configuration, the single DAC circuit 221 is configured to generate different basis functions for the control signals, e.g., a Gaussian pulse for qubit control, a Gaussian square pulse for a readout control signal, etc.

In some embodiments, the DAC circuits 211 and 221 comprise control pulse envelope generators which are configured to implement pulse-shaping techniques to generate the different types of control pulses with desired control pulse envelope shapes (e.g., Gaussian pulses, cosine pulses (e.g., sum of half cosines), hyperbolic secant pulses, etc.), which are used to generate the RF control signals (RF_Q and RF_RO) and the pulse flux bias signals (Flux_Pulse), as needed. In addition, pulse-shaping techniques include DRAG (derivative removal by adiabatic gate) correction pulses, which can be used in conjunction with shaped pulses (such as Gaussian pulses, cosine pulses, or hyperbolic secant pulses) to further suppress unwanted state transitions, while maintaining a same pulse envelope area (or integral of pulse envelope). In other embodiments, the DAC circuits 211 and 221 can have inputs coupled to a control pulse envelope generator which generates digital signals corresponding to different types of control pulses, and which inputs the digital signals to the DAC circuits 211 and 221 to generate the analog control pulses, as directed.

As schematically illustrated in FIG. 2, in the first control block 210, the DAC circuit 211 comprises a Q output port that is coupled to an input terminal of the switch S1 and an I output port that is coupled to an input terminal of the switch S2. The switch S1 comprises a first output terminal (+) that is coupled to an input port of the filter 214-1, and a second output terminal (−) that is coupled to an input port of the filter 214-3. The switch S2 comprises a first output terminal (+) that is coupled to an input port of the filter 214-2, and a second output terminal (−) that is coupled to an input port of the filter 214-4. The switch S3 comprises an input terminal that is coupled to an output port of the filter 214-2, a first output terminal (+) that is coupled to an I input port of the I/Q mixer 212-1, and a second output terminal (−) that is coupled to an I input port of the I/Q mixer 212-2. The switch S4 comprises an input terminal that is coupled to an output port of the filter 214-1, a first output terminal (+) that is coupled to a Q input port of the I/Q mixer 212-1, and a second output terminal (−) that is coupled to a Q input port of the I/Q mixer 212-2.

Furthermore, in the first control block 210, the first I/Q mixer 212-1 comprises an LO input port coupled to an output port of the LO signal generator 230-1, and an RF output port that is coupled to a first input terminal of the signal combiner 213-1. The second I/Q mixer 212-2 comprises an LO input port coupled to an output port of the LO signal generator 230-2, and an RF output port that is coupled to a second input terminal of the signal combiner 213-1. The signal combiner 213-1 comprises an output port that is coupled to the first qubit 262 through the signal chain 252. The signal combiner 213-2 comprises a first input port coupled to an output port of the filter 214-3, a second input port coupled to the DC current source 240-2, and an output port that is coupled to the first flux-tunable coupler 261 through the signal chain 251. The signal combiner 213-3 comprise a first input port coupled to an output port of the filter 214-4, a second input port coupled to the DC current source 240-1, and an output port that is coupled to the second flux-tunable coupler 263 through the signal chain 253.

As further schematically illustrated in FIG. 2, in the second control block 220, the DAC circuit 221 comprises a Q output port that is coupled to an input port of the filter 224-1 and an I output port that is coupled to an input port of the filter 224-2. The switch S5 comprises an input terminal that is coupled to an output port of the filter 224-1, a first output terminal (+) that is coupled to a Q input port of the I/Q mixer 222-2, and a second output terminal (−) that is coupled to a Q input port of the I/Q mixer 222-1. The switch S6 comprises an input terminal that is coupled to an output port of the filter 224-2, a first output terminal (+) that is coupled to an I input port of the I/Q mixer 222-2, and a second output terminal (−) that is coupled to an I input port of the I/Q mixer 222-1. The I/Q mixer 222-2 comprises an LO input port coupled to an output port of the LO signal generator 230-3, and an RF output port that is coupled to a first input terminal of the signal combiner 223. The I/Q mixer 222-1 comprises an LO input port coupled to an output port of the LO signal generator 230-4, and an RF output port that is coupled to a second input terminal of the signal combiner 223. The signal combiner 223 comprises an output port that is coupled to the second qubit 264 through the signal chain 254.

The first control block 210 is configured to implement a time-domain multiplexing scheme to control the operation of the single DAC circuit 211 and the switching circuitry (e.g., switches S1, S2, S3, and S4) to generate and route different control signals, at different times, to control operation of the first qubit 262 and the first and second flux-tunable couplers 261 and 263. For example, at a given time, the first control block 210 can generate and apply a readout control signal RF_RO to the first qubit 262 by performing a control process which comprises (i) applying switch control signals to the switches S1, S2, S3, and S4 to cause the switches S1, S2, S3, and S4 to connect the respective input terminals to the respective first output terminals (+) to thereby generate electrical paths from the I and Q output ports of the DAC circuit 211 to the I and Q input ports of the I/Q mixer 212-1, (ii) control the DAC circuit 211 to generate I and Q baseband signals with a desired pulse envelope for the readout control signal, and (iii) apply the I and Q baseband signals and the LO_RO signal to the I/Q mixer 212-1 to generate a readout control signal RF_RO at the RF output port thereof. The readout control signal RF_RO is transmitted along the signal chain 252 and applied (via capacitive coupling) to the first qubit 262 to initiate a readout operation to readout the state of the first qubit 262.

At another time, the first control block 210 can generate and apply a qubit control signal RF_Q to the first qubit 262 by performing a control process which comprises (i) applying switch control signals to the switches S1, S2, S3, and S4 to cause the switches S1, S2, S3, and S4 to connect the respective input terminals to the respective second output terminals (−) to thereby generate electrical paths from the I and Q output ports of the DAC circuit 211 to the I and Q input ports of the I/Q mixer 212-2, (ii) control the DAC circuit 211 to generate I and Q baseband signals with a desired pulse envelope for the qubit control signal, and (iii) apply the I and Q baseband signals and the LO_Q signal to the I/Q mixer 212-2 to generate a qubit control signal RF_Q at the RF output port thereof. The qubit control signal RF_Q is transmitted along the signal chain 252 and applied (via capacitively coupling) to the first qubit 262 to change a state of the first qubit 262.

At another time, the first control block 210 can generate and apply a flux pulse control signal (Flux_Pulse) to the first flux-tunable coupler 261 by performing a control process which comprises (i) applying a switch control signal to the switch S1 to connect the input terminal to the second output terminal (−) to thereby generate an electrical path from the Q output port of the DAC circuit 211, through the filter 214-3, and to the first input port of the signal combiner 213-2 (while the switches S2, S3, and S4 are in an off state), and (ii) controlling the DAC circuit 211 to generate and output a flux pulse control signal (Flux_Pulse) from the Q output port thereof. The signal combiner 213-2 couples the flux pulse control signal (Flux_Pulse) to the signal chain 251, where the flux pulse control signal is transmitted and applied to the SQUID of the first flux-tunable coupler 261 (via inductive coupling) to "activate" the first flux-tunable coupler 261.

Furthermore, at another time, the first control block 210 can generate and apply a flux pulse control signal (Flux_Pulse) to the second flux-tunable coupler 263 by performing a control process which comprises (i) applying a switch control signal to the switch S2 to connect the input terminal to the second output terminal (−) to thereby generate an electrical path from the I output port of the DAC circuit 211, through the filter 214-4, and to the first input port of the signal combiner 213-3, and (ii) controlling the DAC circuit 211 to generate and output a flux pulse control signal (Flux_Pulse) from the I output port thereof. The signal combiner 213-3 couples the flux pulse control signal (Flux_Pulse) to the signal chain 253, where the flux pulse control signal is transmitted and applied to the SQUID of the second flux-tunable coupler 263 (via inductive coupling) to "activate" the second flux-tunable coupler 263.

The second control block 220 is configured to implement a time-domain multiplexing scheme to control the operation of the single DAC circuit 221 and the switching circuitry (e.g., switches S5 and S6) to generate and route different control signals, at different times, to control operation of the second qubit 264. For example, at a given time, the second control block 220 can generate and apply a readout control signal RF_RO to the second qubit 264 by performing a control process which comprises (i) applying switch control signals to the switches S5 and S6 to cause the switches S5 and S6 to connect the respective input terminals to the respective first output terminals (+) to thereby generate electrical paths from the I and Q output ports of the DAC circuit 221 to the I and Q input ports of the I/Q mixer 222-1, (ii) control the DAC circuit 221 to generate I and Q baseband signals with a desired pulse envelope for the readout control signal, and (iii) apply the I and Q baseband signals and the LO_RO signal (from the LO signal generator 230-3) to the I/Q mixer 222-2 to generate a readout control signal RF_RO at the RF output port thereof. The signal combiner 223 couples the readout control signal RF_RO to the signal chain 254 and transmitted along the signal chain 254 and applied (via capacitive coupling) to the second qubit 264 to initiate a readout operation to readout the state of the second qubit 264.

Further, at another time, the second control block 220 can generate and apply a qubit control signal RF_Q to the second qubit 264 by performing a control process which comprises (i) applying switch control signals to the switches S5 and S6 to cause the switches S5 and S6 to connect the respective input terminals to the respective second output terminals (−) to thereby generate electrical paths from the I and Q output ports of the DAC circuit 221 to the I and Q input ports of the I/Q mixer 222-1, (ii) control the DAC circuit 221 to generate I and Q baseband signals with a desired pulse envelope for the qubit control signal, and (iii) apply the I and Q baseband signals and the LO_Q signal (from the LO signal generator 230-4) to the I/Q mixer 222-1 to generate a qubit control signal RF_Q at the RF output port thereof. The signal combiner 223 couples the qubit control signal RF_Q to the signal chain 254, where the qubit control signal is transmitted along the signal chain 254 and applied (via capacitive coupling) to the second qubit 264 to change a state of the second qubit 264.

In some embodiments, the control system 205 is configured to operate with a complementary quadrature signal framework, in which the DAC circuits 211 and 221 are configured to generate complementary in-phase signals $I(t)$ and $\overline{I(t)}$, complementary quadrature-phase signals $Q(t)$ and $\overline{Q(t)}$, and the LO signal generators are configured to generate complementary quadrature LO signals comprising complementary in-phase LO signals LO_I and $\overline{LO\_I}$, and complementary quadrature-phase LO signals LO_Q and $\overline{LO\_Q}$. Ideally, the complementary quadrature LO signals LO_I, LO_Q, $\overline{LO\_I}$, and $\overline{LO\_Q}$ have the same amplitude and center frequency, but different phases of 0°, 90°, 180°, and 270°, respectively. For the complementary quadrature signal framework, the various switches which comprise the switching circuitry shown in FIG. 2 may comprise double pole double throw switch devices to route the complementary I and Q signal outputs of the DAC circuits 211 and 212.

As compared to the control signal generator circuitry 105 shown in FIG. 1, the time-domain multiplexing architecture of the control system 205 shown in FIG. 2 allows a reduction in the number of DAC circuits that are needed to generate control signals. The time-domain multiplexing architecture of the control system 205 enables sharing of the DAC circuits and other on-chip components (e.g., filters) of the control signal paths of the control system 205 to generate and transmit control signals to a plurality of quantum devices. In the exemplary embodiment of FIG. 2, it is assumed that the first and second control blocks 210 and 220 are implemented "on-chip" (e.g., control ASIC) while the other components, e.g., LO signal generators and DC current sources 240 are disposed "off-chip." Advantageously, the reduction in the number of DAC circuits and the sharing of other control system components serves to reduce the footprint area of the control ASIC, as well as reduce the DC power dissipation of the control chip.

FIG. 2 shows an exemplary embodiment in which the control system 205 is configured to control a superconducting quantum processor 260 which comprises an array of superconducting qubits and superconducting flux-tunable coupler devices, wherein the flux-tunable coupler devices are configured to control exchange interactions between adjacent qubits. For case of illustration, FIG. 2 shows the quantum processor 260 having a "unit cell" of four quantum devices (e.g., qubits 262 and 264 and first and second flux-tunable couplers 261 and 263) which are controlled by a "control basis" comprising the first and second control blocks 210 and 220. In this regard, the first and second control blocks 210 and 220 can be considered a "control basis" for controlling the "unit cell" of the four quantum devices 261, 262, 263, and 264, since the first and second control blocks 210 and 220 comprise basic control blocks for the "unit cell" of the four quantum devices 261, 262, 263, and 264. In this regard, the quantum processor 260 can be expanded with a qubit array which comprise two or more additional "unit cells," in which case the control system 205 is expanded to include additional instances of the first and second control blocks 210 and 220, accordingly.

The exemplary control optimization schemes as discussed above can be utilized to implement a control system with a time-domain multiplexing architecture, which is designed to target a specific application such as quantum error correction. Quantum error correction (QEC) techniques are utilized in quantum computing to protect quantum information from errors due to, e.g., decoherence of qubit states, quantum noise, etc. As explained in further detail below, the first and second control blocks 210 and 220 as shown in FIG. 2 can be utilized as a control basis for a heavy hexagonal qubit lattice with a flux-tunable bus architecture, to control qubit gate operations (e.g., single-gate operations, entanglement gate operations, etc.), and to control the execution of syndrome cycles for error detection for quantum error correction. Furthermore, as explained in further detail below, the first control block 210 as shown in FIG. 2 can be utilized as a control basis for a square qubit lattice with a flux-tunable bus architecture, to control qubit gate operations and to control the execution of syndrome cycles for error detection.

Figure 3:
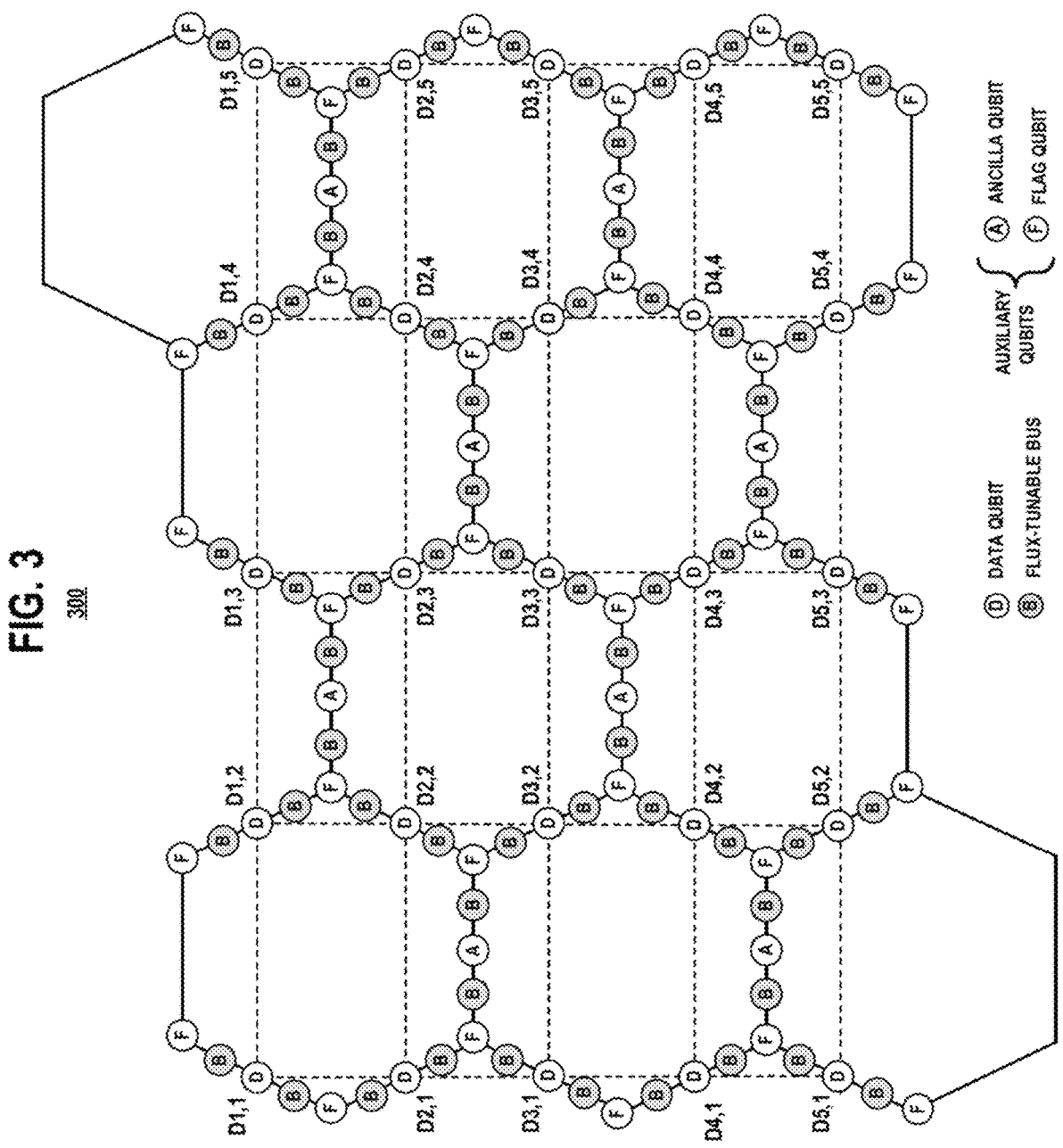
FIG. 3 schematically illustrates a heavy hexagonal qubit lattice with a flux-tunable bus architecture, which can be controlled using a time-domain multiplexing control signal architecture, according to an exemplary embodiment of the disclosure.

For example, FIG. 3 schematically illustrates a heavy hexagonal qubit lattice with a flux-tunable bus architecture, which can be controlled using a time-domain multiplexing control signal architecture, according to an exemplary embodiment of the disclosure. In particular, FIG. 3 schematically illustrates a heavy hexagonal qubit lattice 300 which comprises an array of data qubits (denoted D), flux-tunable busses (denoted B), and auxiliary qubits comprising ancilla qubits (dented A) and flag bits (denoted F). A heavy hexagonal topology such as shown in FIG. 3 can be used to implement a superconducting quantum processor architecture having a qubit lattice with surface codes to enable quantum error correction.

As generally shown in FIG. 3, the heavy hexagonal qubit lattice 300 comprises a plurality of hexagonal unit cells, where each hexagonal unit cell of the lattice comprises a hexagonal arrangement of qubits, and where a qubit is located at each vertex and on each edge of the hexagonal unit cells. More specifically, as shown in FIG. 3, a flag qubit (F) is located at each vertex, and each edge comprises either an ancilla qubit (A) or a data qubit (D). Furthermore, in the exemplary heavy hexagonal qubit lattice 300, each flux-tunable bus (B) is disposed on a given edge between adjacent qubits. In particular, each flux-tunable bus (B) is disposed either (i) between a data qubit (D) and a flag qubit (F) or (ii) between an ancilla qubit (A) and a flag qubit (F). The term "data qubit" as used herein refers to a superconducting quantum bit that is utilized to store computational states of a quantum system. In addition, the term "auxiliary qubit" as used herein generally refers to a superconducting quantum bit which is utilized to facilitate one or more error detection/correction operations associated with one or more superconducting data qubits. The auxiliary qubits (e.g., ancilla qubits (A) and flag qubits (F)) are repeatedly and frequently interacted with neighboring data qubits (D) (via operation of the flux-tunable busses (B)) and measured to detect the presence of errors, while the data qubits (D) are controlled and measured to perform computations.

Further, in the context of quantum error correction, data qubits are utilized to encode logical qubits, in quantum error correction codes. A logical qubit is encoded in the entangled state of many physical qubits. For example, an error-corrected logical qubit is generated by distributing a quantum state among a plurality of connected data qubits, wherein error correction is enabled by using the auxiliary qubits (e.g., ancilla qubits (A) and flag qubits (F)) which are neighboring the data qubits associated with the logical qubit. The states of the auxiliary qubits can be readout and analyzed to infer or otherwise determine if an error exists in the encoded states of the data qubits that are part of the logical qubit.

For a heavy hexagonal qubit lattice, the size of a logical qubit is proportional to a dimensionality constant (denoted d) for error correction, wherein each logical qubit within a given heavy hexagonal qubit lattice comprises a d×d array of data qubits. FIG. 3 illustrates an exemplary embodiment of a heavy hexagonal qubit lattice (or a portion thereof) in which d=5, wherein a logical qubit of the heavy hexagonal qubit lattice 300 comprises a 5×5 array of data qubits (D). In FIG. 3, the logical qubit comprises an array of data qubits represented by horizontal and vertical dashed lines that intersect a 5×5 array of data qubits. The data qubits (D) of the logical qubit are indexed by Di, j, where i={1, 2, 3, 4, 5} and j={1, 2, 3, 4, 5}. For the exemplary heavy hexagonal qubit lattice 300, quantum error correction can correct up to $$\frac{d-1}{2}$$

faults, wherein a minimum of d syndrome cycles are performed to detect and correct errors.

As noted above, a quantum error correction process utilizes auxiliary qubits to determine an error syndrome. For example, an error syndrome can be determined by a process which comprises performing a series of operations in which auxiliary qubits are entangled with data qubits, and then the auxiliary qubits are measured to determine if an error exists in the encoded states of the data qubits. The syndrome measurement provides information regarding the error which has occurred, but does not provide the quantum information stored in the logical qubit, since the measurement would destroy any quantum superposition of the logical qubit with other qubits in the quantum system. Quantum error correction also employs syndrome measurements which, depending on the QEC code used, can determine the occurrence, location and type of errors.

Figure 4A:
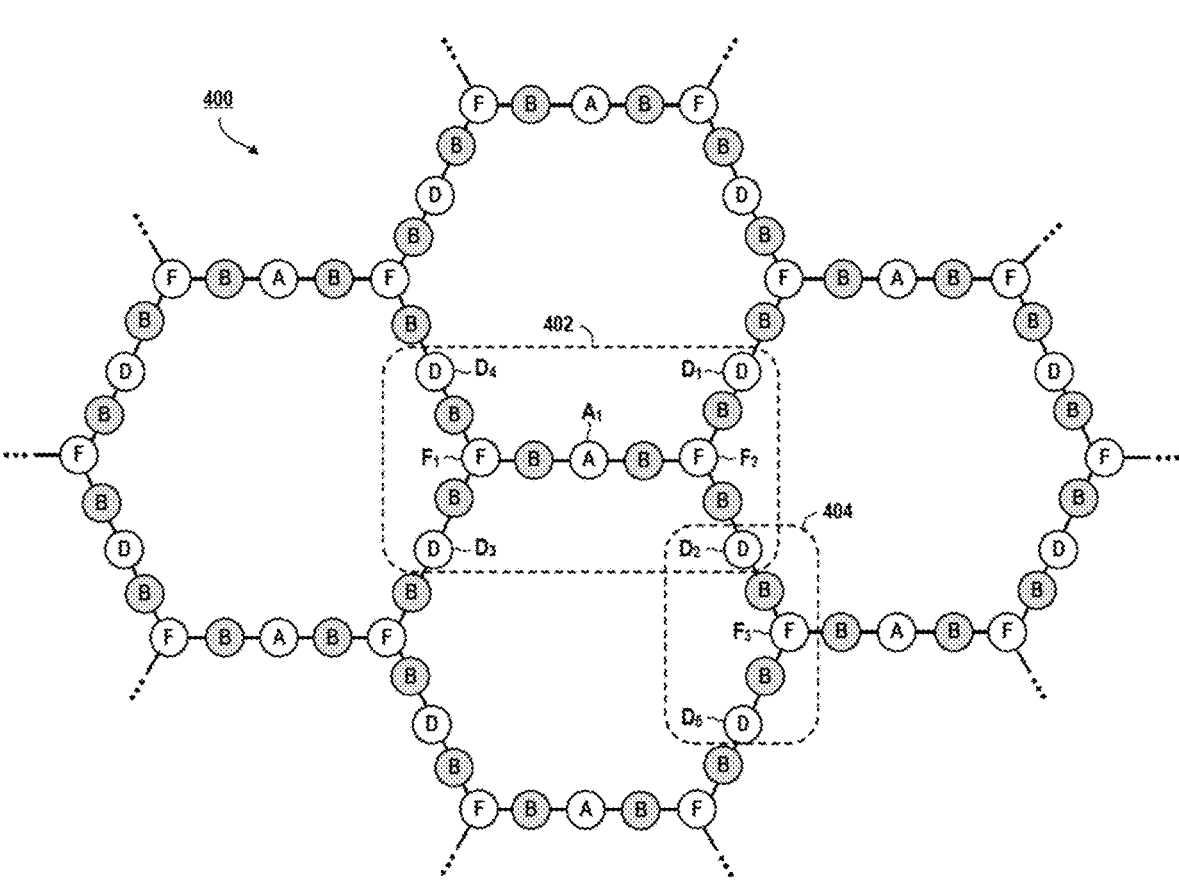
FIGS. 4A, 4B, and 4C schematically illustrate syndrome measurements that can be performed on a heavy hexagonal qubit lattice, according to an exemplary embodiment of the disclosure.
Figure 4B:
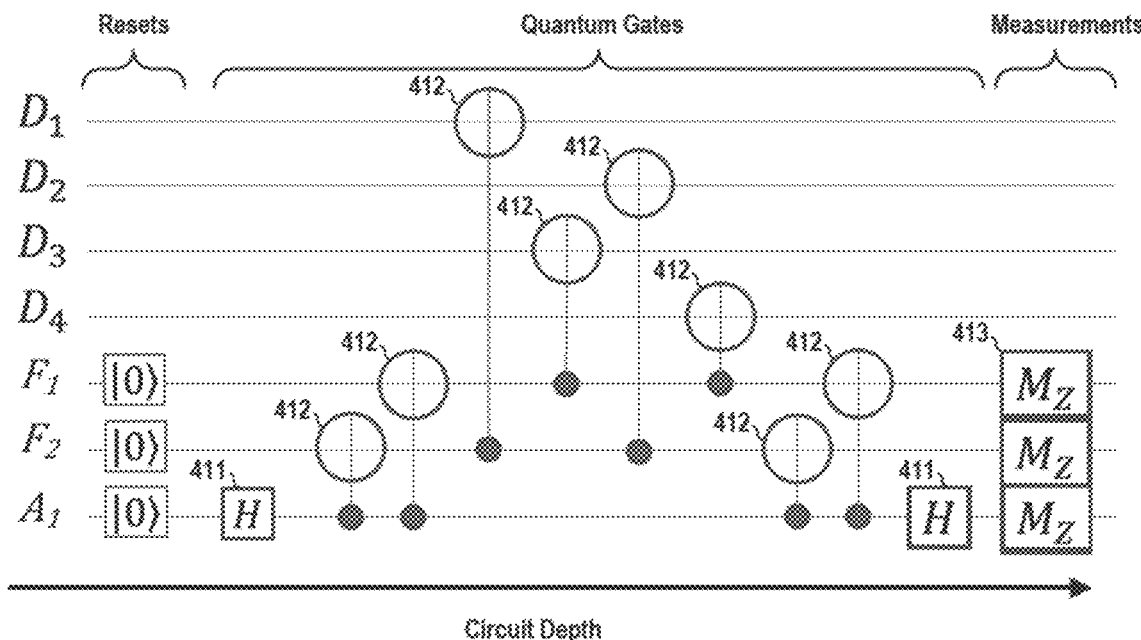
Figure 4C:
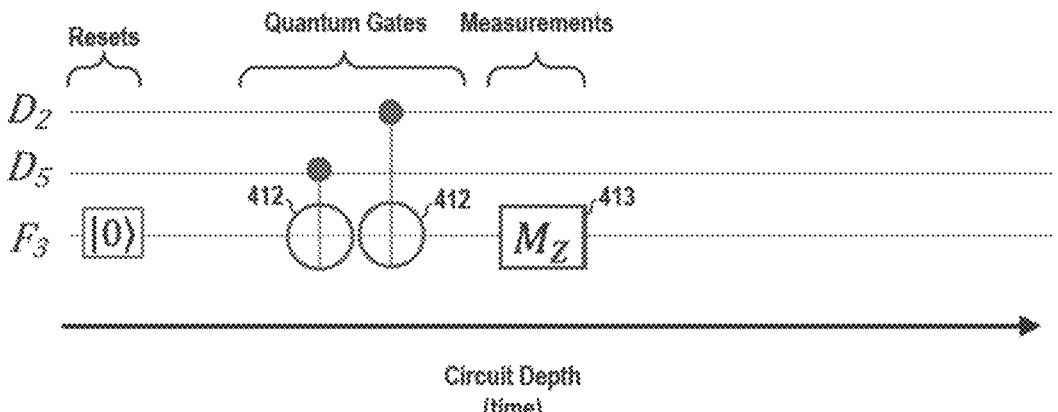

FIGS. 4A, 4B, and 4C illustrate syndrome measurements that can be performed on a heavy hexagonal qubit lattice, according to an exemplary embodiment of the disclosure. More specifically, FIG. 4A schematically illustrates a heavy hexagonal qubit lattice 400 and quantum error correction codes (e.g., surface codes) including an X-stabilizer code 402 and a Z-stabilizer code 404. The architecture of the heavy hexagonal qubit lattice 400 is the same as the heavy hexagonal qubit lattice 300 of FIG. 3, but wherein FIG. 4A shows a portion of the heavy hexagonal qubit lattice comprising four (4) hexagonal unit cells, for purposes of discussion. The X-stabilizer code 402 includes a group of four data qubits $D_1$, $D_2$, $D_3$, and $D_4$, and three auxiliary qubits (or syndrome qubits) including one ancilla qubit $A_1$ and two flag qubits $F_1$ and $F_2$. For the X-stabilizer code 402, the ancilla qubit $A_1$ and flag qubits $F_1$ and $F_2$ are utilized to detect phase-flip errors of the data qubits $D_1$, $D_2$, $D_3$, and $D_4$. The Z-stabilizer code 404 includes a group two data qubits $D_2$ and $D_5$, and one auxiliary qubit including a flag qubit $F_3$. For the Z-stabilizer code 404, the flag qubit $F_3$ is utilized to detect bit-flip errors of the data qubits $D_2$ and $D_5$.

FIG. 4B illustrates a quantum circuit which comprises an X-stabilizer circuit 410 that is configured to analyze the X-stabilizer code 402 shown in FIG. 4A. In addition, FIG. 4C illustrates a quantum circuit which comprises a Z-stabilizer circuit 420 that is configured to analyze the Z-stabilizer code 404 shown in FIG. 4A. In general, a quantum circuit is a computational routine which comprises coherent quantum operations on quantum data, such as qubits, and concurrent real-time classical computation. A quantum circuit comprises an ordered sequence of resets, quantum gates, measurements, which may be conditioned on and utilize data from the real-time classical computation. A stabilizer circuit is a type of quantum circuit in which every quantum gate is either a controlled-NOT gate (or CNOT gate), a Hadamard gate, a phase gate, or a 1-qubit measurement gate.

As shown in FIG. 4B, the X-stabilizer circuit 410 comprises the data qubits $D_1$, $D_2$. $D_3$, and $D_4$ and the three auxiliary qubits including the ancilla qubit $A_1$ and the two flag qubits $F_1$ and $F_2$, which are represented by respective horizontal lines in the X-stabilizer circuit 410. The flow of information and the sequence of gate operations progresses from left to right. As shown in FIG. 4B, the X syndrome quantum computation begins with well-defined quantum states, which are achieved using initialization and reset operations to initialize each of the three auxiliary qubits (ancilla qubit $A_1$ and flag qubits $F_1$ and $F_2$) into a ground state $|0\rangle$ by, e.g., applying single-qubit gates.

Next, a sequence of gate operations are performed on the data and auxiliary qubits, which include Hadamard gates 411 and CNOT gates 412. As is known in the art, applying the Hadamard gate to a qubit that is in a ground state $|0\rangle$ brings the qubit into a superposition state where the probability of measuring $|0\rangle$ is equal to the probability of measuring $|1\rangle$. A CNOT gate is a two-qubit gate which operates on a pair of qubits, with one qubit acting as A "control" qubit (represented by small solid circle) and the other qubit acting as a "target" qubit (represented by large circle). The CNOT gate performs a NOT on the target qubit (e.g., flips the state of the target qubit) whenever the control qubit is in a $|1\rangle$ state. If the control qubit is in a superposition state, the CNOT gate creates entanglement.

As shown in FIG. 4B, after the state resets of the auxiliary qubits $A_1$, $F_1$, and $F_2$, the first gate operation is a Hadamard gate 411 that is applied to the ancilla qubit $A_1$. Next, a CNOT gate 412 is performed between the ancilla qubit $A_1$ (control) and the flag qubit $F_2$ (target), which is then followed by performing a CNOT gate 412 between the ancilla qubit $A_1$ (control) and the flag qubit $F_1$ (target). Thereafter, as shown in FIG. 4B, a plurality of CNOT gates 412 are applied between the auxiliary qubits (as the control qubits) and the data qubits (as the target qubits), followed by additional CNOT gate operations between the ancilla qubit $A_1$ (control) and the flag qubits $F_2$ and $F_1$ (targets). Following the CNOT gate operations, another Hadamard gate 411 is applied to the ancilla qubit $A_1$. Finally, Z-basis measurements 413 are performed on each of the auxiliary qubits $A_1$, $F_1$ and $F_2$, which represent the X-syndrome measurement for the X-stabilizer circuit 410. It is to be noted that for the ancilla qubit $A_1$, the combination of the Hadamard gate 411 followed by the Z-basis measurements 413 is equivalent to an X-basis measurement of the ancilla qubit $A_1$. In this regard, measurement of the ancilla qubit $A_1$ in the X-basis (phase of qubit on Bloch sphere) provides an indication of potential X-errors that have occurred on the data qubits.

Next, as shown in FIG. 4C, the Z-stabilizer circuit 420 comprises the data qubits $D_2$ and $D_5$ and the flag qubit $F_3$, which are represented by respective horizontal lines in the Z-stabilizer circuit 420. The Z syndrome computation begins with resetting/initializing the flag qubit $F_3$ into a ground state $|0\rangle$. Thereafter, a CNOT gate 412 is applied between the flag qubit $F_3$ (target) and the data qubit $D_5$ (control), followed by a CNOT gate 412 applied between the flag qubit $F_3$ (target) and the data qubit $D_2$ (control). Finally, a Z-basis measurements 413 is performed on the flag qubit $F_3$. In this regard, measurement of the flag qubit $F_3$ in the Z-basis provides an indication of potential Z-errors that have occurred on the data qubits.

As illustrated in FIGS. 4A, 4B, and 4C, the X and Z syndrome measurements are performed with overlap on the data quit $D_2$. In a given syndrome cycle, the X and Z-stabilizer circuits 410 and 420 are applied over the entire heavy hexagonal qubit lattice structure (in the same overlapping manner for all data qubits within the array) to obtain X and Z syndrome measurements for the given cycle. The same syndrome cycle is repeated for a minimum of d times where, as noted above, d represents the dimensionality constant for logical qubits in the array. Next, the X and Z syndrome measurement information that is obtained over the d syndrome cycles is utilized to detect for possible errors that have occurred in a given logical qubit. For example, the results of the d syndrome measurement cycles are decoded to identify error locations (e.g., identify data qubits with X and/or Z errors).

In some embodiments, time-domain multiplexing control circuitry is utilized to operate the data qubits, auxiliary qubits, and flux-tunable couplers of a heavy hexagonal qubit lattice such as shown in FIG. 3, and to perform X and Z syndrome measurements for quantum error correction codes (e.g., surface codes) of a heavy hexagonal qubit lattice such as shown in FIGS. 4A, 4B, and 4C. For example, in some embodiments, a time-domain multiplexing control system for performing X and Z syndrome measurements is implemented using multiple instances of the first and second control blocks 210 and 220 of the control system 205 (FIG. 2), which will now be discussed in detail in conjunction with FIGS. 5A, 5B, 6A, 6B, 7A, 7B, and 7C.

Figures 5A, 5B:
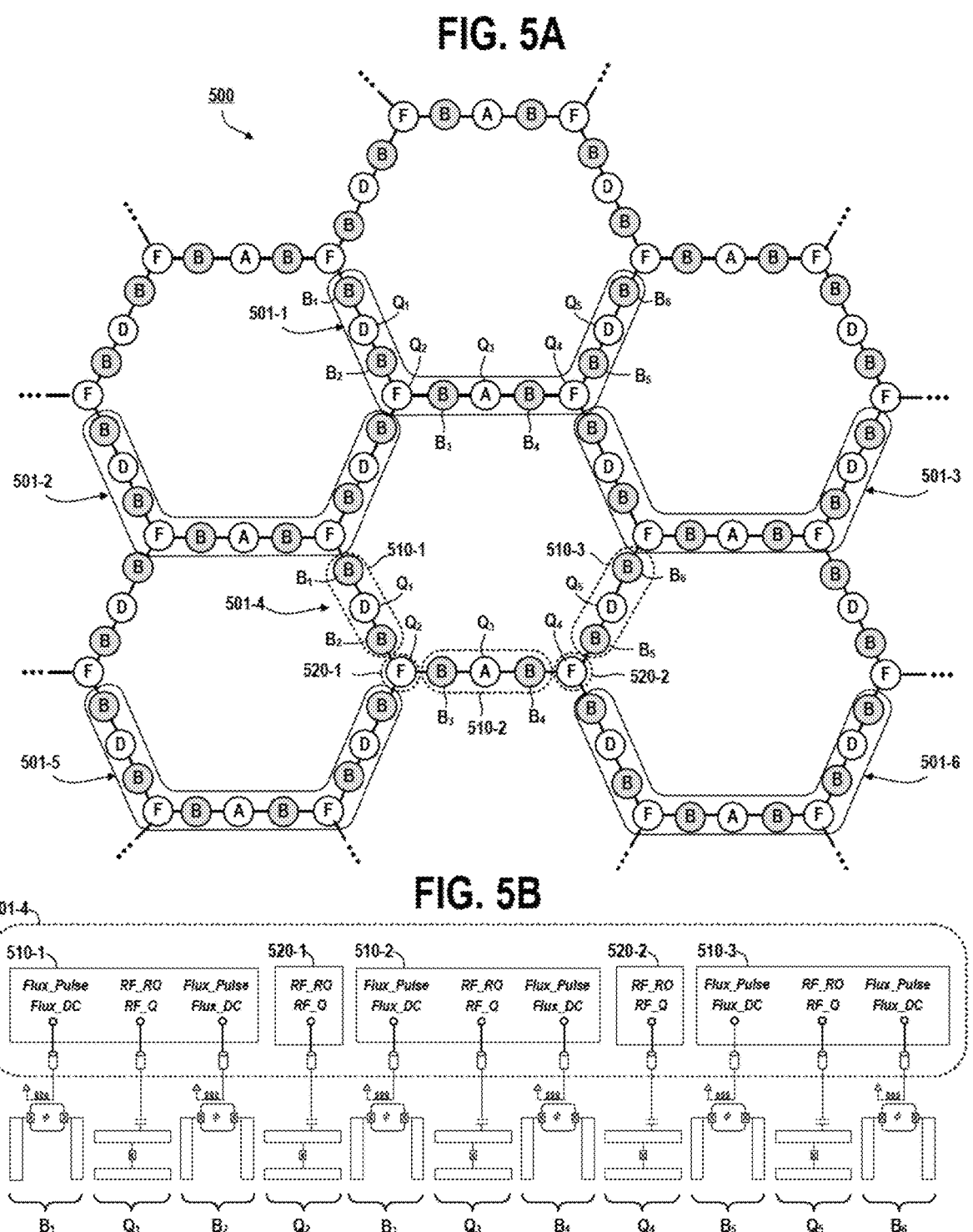
FIGS. 5A and 5B schematically illustrate a quantum computing system comprising a heavy hexagonal qubit lattice and a time-domain multiplexing control system that is configured to control operation of the heavy hexagonal qubit lattice, according to an exemplary embodiment of the disclosure.

For example, FIGS. 5A and 5B schematically illustrate a quantum computing system comprising a heavy hexagonal qubit lattice and a time-domain multiplexing control system that is configured to control operation of the heavy hexagonal qubit lattice, according to an exemplary embodiment of the disclosure. In particular, FIG. 5A schematically illustrates a portion of a heavy hexagonal qubit lattice 500 which can be implemented on a superconducting quantum processor. The architecture of the heavy hexagonal qubit lattice 500 is similar to that shown in FIGS. 3 and 4A, the details of which will not be repeated. FIG. 5A further schematically illustrates a plurality of unit control cells 501-1, 501-2, 501-3, 501-4, 501-5, 501-6, etc., wherein each unit control cells 501-1, 501-2, 501-3, 501-4, 501-5, 501-6, etc., is configured to control a group of five (5) qubits (e.g., $Q_1$, $Q_2$, $Q_3$, $Q_4$, and $Q_5$) and six (6) flux-tunable busses (e.g., $B_1$, $B_2$, $B_3$, $B_4$, $B_5$, and $B_6$) in the heavy hexagonal qubit lattice 500. The unit control cells 501-1, 501-2, 501-3, 501-4, 501-5, 501-6, etc., each have the same unit control cell circuit architecture, wherein multiple instances of the unit control cell are formed on a control ASIC which is used to control the operation of the heavy hexagonal qubit lattice 500.

In some embodiments, each unit control cell 501-1, 501-2, 501-3, 501-4, 501-5, 501-6, etc., comprises multiple instances of the first control block 210 and the second control block 220, as shown and discussed above in conjunction with FIG. 2. In particular, for illustrative purposes, FIGS. 5A and 5B schematically illustrate constituent control blocks 510-1, 510-2, 510-3, 520-1, and 520-2 that are associated with the unit control cell 501-4, wherein each control block 510-1, 510-2, 510-3 comprises an instance of the first control block 210 (FIG. 2), and wherein each control block 520-1 and 520-2 comprises an instance of the second control block 220 (FIG. 2). As shown in FIGS. 5A and 5B, the control block 510-1 is configured to control operation of the qubit $Q_1$ and the flux-tunable busses $B_1$ and $B_2$. The control block 520-1 is configured to control operation the qubit $Q_2$. The control block 510-2 is configured to control operation of the qubit $Q_3$ and the flux-tunable busses $B_3$ and $B_4$. The control block 520-2 is configured to control operation the qubit $Q_4$. The control block 510-3 is configured to control operation of the qubit $Q_5$ and the flux-tunable busses $B_5$ and $B_6$.

With this exemplary configuration using time-domain multiplexing of control signals, each unit control cell 501-1, 501-2, 501-3, 501-4, 501-5, 501-6, etc., comprises a total of five (5) on-chip DAC circuits, as compared to 22 on-chip DAC circuits that would be required for each to control the 11 quantum devices (5 qubits and 6 flux-tunable buses) based on the control system architecture of FIG. 1. The exemplary time-domain multiplexing control architecture is possible given that, e.g., the adjacent flux-tunable buses, which are controlled by the respective control blocks 510-1, 510-2, and 510-3, do not need to be operated concurrently (via flux pulses control signals) to properly control operation of the heavy hexagonal qubit lattice 500. In particular, the flux-tunable buses $B_1$ and $B_2$ are not operated concurrently by the control block 510-1, the flux-tunable buses $B_3$ and $B_4$ are not operated concurrently by the control block 510-2, and the flux-tunable buses $B_5$ and $B_6$ are not operated concurrently by the control block 510-3. Moreover, the time-domain multiplexing control architecture is possible given that each of the respective control blocks 510-1, 510-2, and 510-3 do not need to generate a readout control pulse and a qubit control pulses at the same time.

Figure 6A:
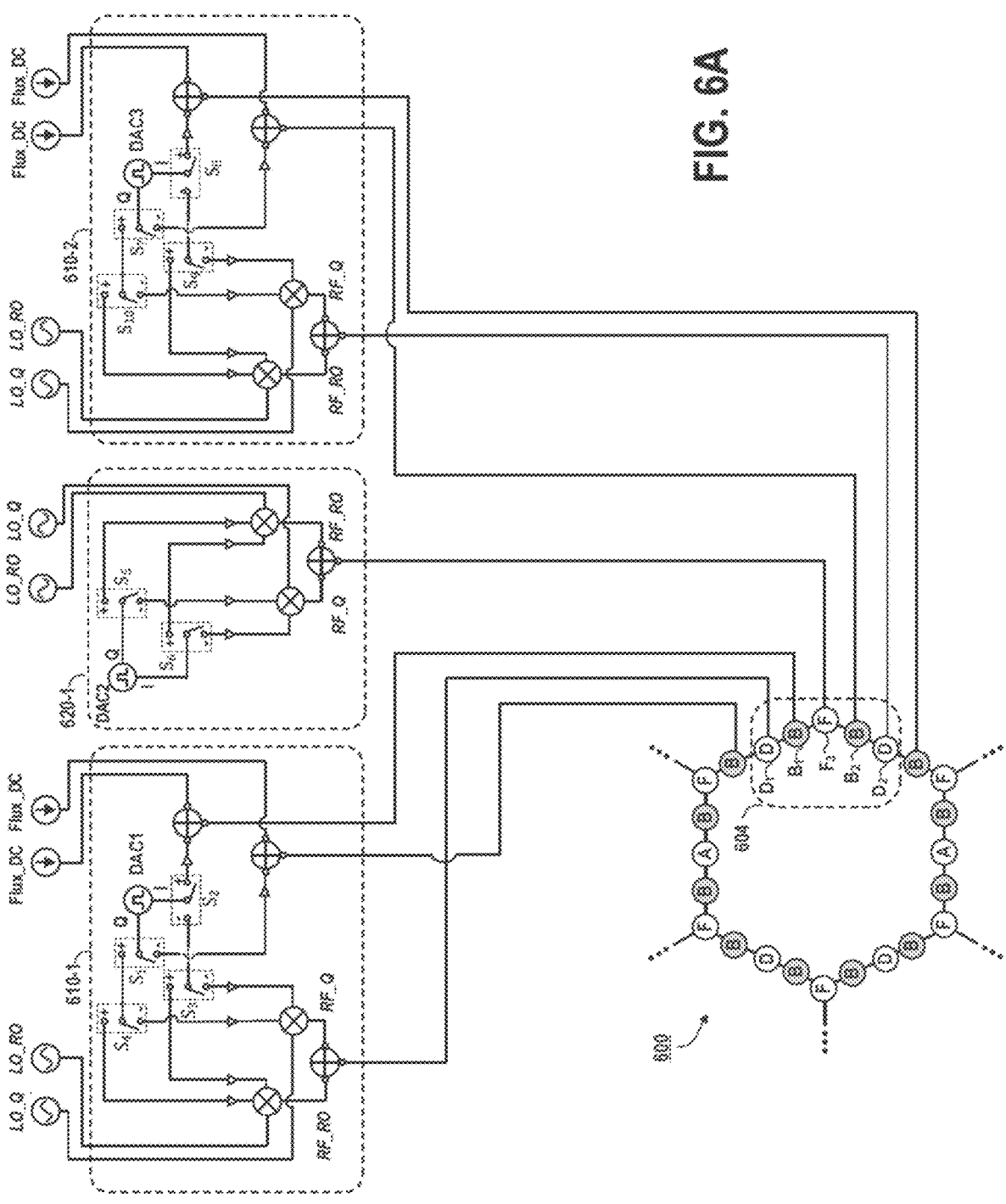
FIGS. 6A and 6B schematically illustrate a process of performing a Z-stabilizer measurement for a quantum error correction code of a heavy hexagonal qubit lattice using a time-domain multiplexing control system, according to an exemplary embodiment of the disclosure.
Figure 6B:
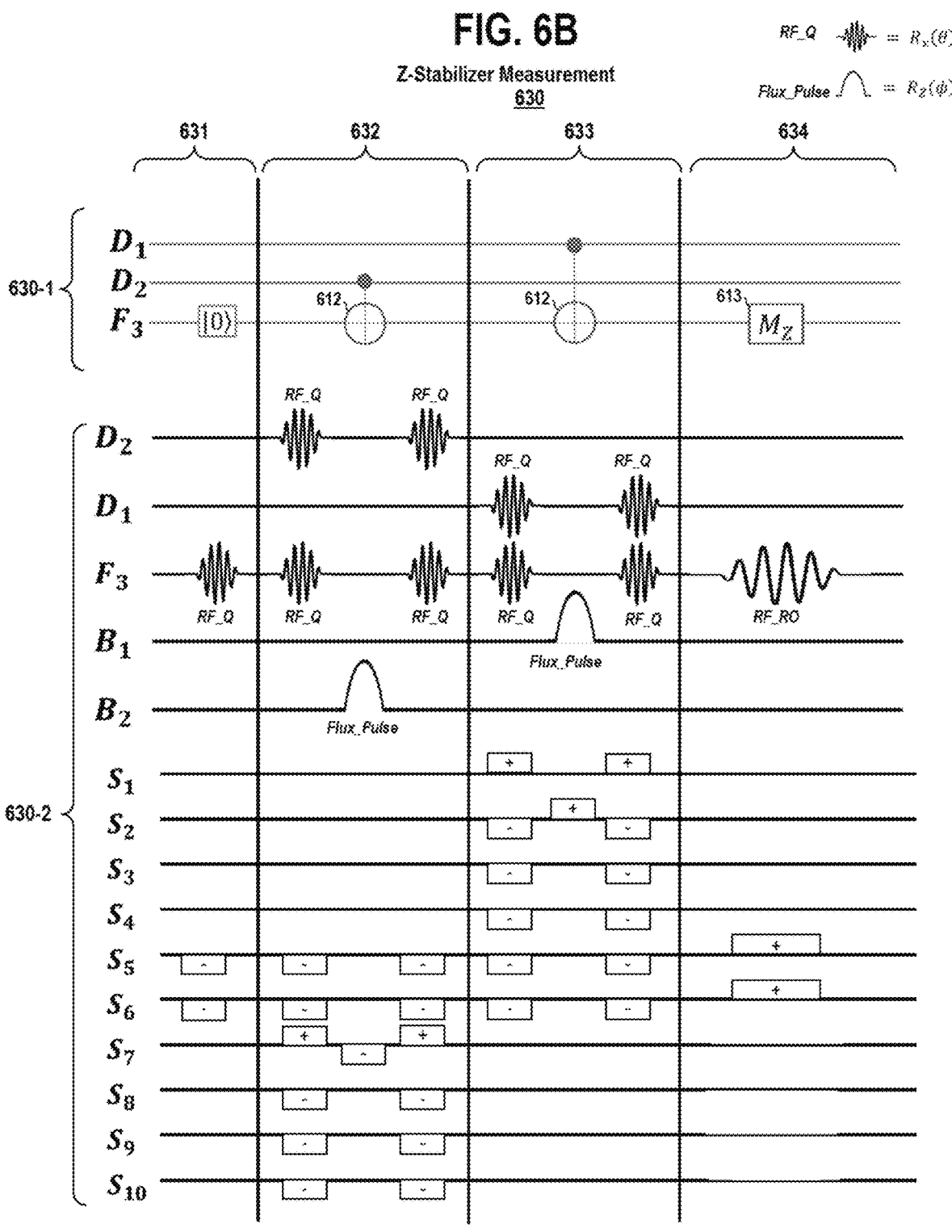

The exemplary time-domain multiplexing control architecture shown in FIGS. 5A and 5B can be configured to perform X-stabilizer and Z-stabilizer measurements for syndrome cycles, such as discussed above in conjunction with FIGS. 4A-4C. For example, FIGS. 6A and 6B schematically illustrate a process of performing a Z-stabilizer measurement (e.g., Z-type parity check) for a quantum error correction code of a heavy hexagonal qubit lattice using a time-domain multiplexing control system, according to an exemplary embodiment of the disclosure. In particular, FIG. 6A schematically illustrates a single unit hexagonal cell of a heavy hexagonal qubit lattice 600 and a quantum error correction code (e.g., surface code) comprising a Z-stabilizer surface code 604. The Z-stabilizer surface code 604 comprises a group of qubits which include data qubits $D_1$ and $D_2$, a flag qubit $F_3$, and flux-tunable busses $B_1$ and $B_2$ (e.g., transmon qubit couplers).

FIG. 6A further illustrates a plurality of control blocks 610-1, 610-2, and 620-1, which are coupled to qubits within the Z-stabilizer surface code 604. More specifically, the control block 610-1 is coupled to the data qubit $D_1$ and flux-tunable bus $B_1$ (and another flux-tunable bus B that is not part of the Z-stabilizer surface code 604). Further, the control block 610-2 is coupled to the data qubit $D_2$ and the flux-tunable bus $B_2$ (and another flux-tunable bus B that is not part of the Z-stabilizer surface code 604). In addition, the control block 620-1 is coupled to the flag qubit $F_3$.

The control block 610-1 is similar in circuit architecture to the first control block 210 of FIG. 2 and comprises a DAC circuit (DAC 1) and switches S1, S2, S3, and S4. The control block 620-1 is similar in circuit architecture to the second control block 220 of FIG. 2 and comprises a DAC circuit (DAC 2) and switches S5 and S6. The control block 610-2 is similar in circuit architecture to the first control block 210 of FIG. 2 and comprises a DAC circuit (DAC 3) and switches S7, S8, S9, and S10. It is to be noted that based on the exemplary layout of the unit control cells 501-1, 501-2, 501-3, 501-4, 501-5, 501-6, etc., shown in FIG. 5A, the control blocks 610-1 and 620-1 would be constituent control blocks of the same unit control cell, while the control block 610-2 would be a constituent control block of another unit control cell.

Next, FIG. 6B schematically illustrates a Z-stabilizer measurement 630 that is performed on the Z-stabilizer surface code 604 using the time-domain multiplexing control circuitry shown in FIG. 6A, according to an exemplary embodiment of the disclosure. In particular, FIG. 6B illustrates a quantum circuit 630-1 for the Z-stabilizer measurement 630, as well as timing diagram 630-2 which shows (i) the qubit and readout control signals and the flux pulse control signals, which are generated to control the qubits $D_1$, $D_2$, and $F_3$ and the flux-tunable busses $B_1$ and $B_2$, and (ii) the switch control signals that are generated to control the operating states of the switches $S_1$-$S_{10}$ to provide time-domain multiplexing of the qubit control and readout signals and the flux pulse control signals. FIG. 6B depicts sequential stages 631, 632, 633, and 634 that are performed for the Z-stabilizer measurement 630.

In the first stage 631 of the Z-stabilizer measurement 630, the state of the flag qubit $F_3$ is reset/initialized into the ground state $|0\rangle$. This is performed by applying switch control signals to the switches $S_5$ and $S_6$ of the control block 620-1 to connect the input terminals of the switches $S_5$ and $S_6$ to the respective second output terminals (−) thereof, and thereby connect the I/Q outputs of the DAC circuit (DAC2) to an I/Q mixer to generate and apply a qubit control signal RF_Q to the flag qubit $F_3$ (through an associated signal combiner and signal chain).

In the second stage 632 of the Z-stabilizer measurement 630, a CNOT gate 612 is applied between the flag qubit $F_3$ (target) and the data qubit $D_2$ (control). The CNOT operation is performed by a process which comprises (i) concurrently generating and applying respective qubit control signals RF_Q to the flag qubit $F_3$ and the data qubit $D_2$ to perform the requisite single-qubit rotations (e.g., X-rotations), (ii) generating and applying a flux pulse control signal Flux_Pulse to the flux-tunable bus $B_2$ to place the flux-tunable bus $B_2$ into an "on" state (activated) and enable an exchange interaction (controlled entanglement) between the flag qubit $F_3$ and the data qubit $D_2$, and (iii) concurrently generating and applying additional qubit control signals RF_Q to the flag qubit $F_3$ and the data qubit $D_2$ to perform the requisite single-qubit rotations (e.g., X-rotations), after the flux-tunable bus $B_2$ is placed into an "off" state (deactivated).

FIG. 6B illustrates the timing of the switch control signals that are applied to the switches $S_5$-$S_{10}$ of the control blocks 620-1 and 610-2 during the second stage 632 of the Z-stabilizer measurement 630. For example, the switches $S_5$ and $S_6$ of the control block 620-1 are controlled as discussed above to apply qubit control signals RF_Q (which are generated by the DAC circuit (DAC2)) to the flag qubit $F_3$ before and after the controlled entanglement operation. Further, the flux pulse control signal Flux_Pulse to turn on (activate) the flux-tunable bus $B_2$ is generated by the DAC circuit (DAC3) of the control block 610-2, and is routed to the flux-tunable bus $B_2$ by applying a switch control signal to the switch S7 of the control block 610-2 to connect the input terminal of the switch $S_7$ to the second output terminal (−) thereof, and thereby couple the Q output of the DAC circuit (DAC3) to the flux-tunable bus $B_2$ (through an associated signal combiner and signal chain).

Moreover, the switches $S_7$, $S_8$, $S_9$, and $S_{10}$ of the control block 610-2 are concurrently controlled to allow qubit control signals RF_Q (which are generated by the DAC circuit (DAC3)) to be applied to the data qubit $D_2$ before and after the controlled entanglement operation. In particular, as shown in FIG. 6B, this is performed by applying a switch control signal to the switch $S_7$ to connect the input terminal of the switch $S_7$ to the first output terminal (+) thereof, and applying switch control signals to the switches $S_8$, $S_9$, and $S_{10}$ to connect the input terminals of the switches $S_8$, $S_9$, and $S_{10}$ to the respective second output terminals (−) thereof. In this switching state of the switches $S_7$, $S_8$, $S_9$, and $S_{10}$, the I/Q signal outputs of the DAC circuit (DAC3) are applied to the I/Q mixer to generate and apply a qubit control signal RF_Q to the data qubit $D_2$.

Next, in the third stage 633 of the Z-stabilizer measurement 630, a CNOT gate 612 is applied between the flag qubit $F_3$ (target) and the data qubit $D_1$ (control). The CNOT operation is performed by a process which comprises (i) concurrently generating and applying respective qubit control signals RF_Q to the flag qubit $F_3$ and the data qubit $D_1$ to perform the requisite single-qubit rotations (e.g., X-rotations), (ii) generating and applying a flux pulse control signal Flux_Pulse to the flux-tunable bus $B_1$ to place the flux-tunable bus $B_1$ into an "on" state (activated) and enable an exchange interaction (controlled entanglement) between the flag qubit $F_3$ and the data qubit $D_1$, and (iii) concurrently generating and applying additional qubit control signals RF_Q to the flag qubit $F_3$ and the data qubit $D_1$ to perform the requisite single-qubit rotations (e.g., X-rotations), after the flux-tunable bus $B_1$ is placed into an "off" state (deactivated).

FIG. 6B illustrates the timing of the switch control signals that are applied to the switches $S_1$-$S_6$ of the control blocks 610-1 and 620-1 during the third stage 633 of the Z-stabilizer measurement 630. For example, the switches $S_5$ and $S_6$ of the control block 620-1 are controlled as discussed above to apply qubit control signals RF_Q (which are generated by the DAC circuit (DAC2)) to the flag qubit $F_3$ before and after the controlled entanglement operation. Further, the flux pulse control signal Flux_Pulse to turn on (activate) the flux-tunable bus $B_1$ is generated by the DAC circuit (DAC1) of the control block 610-1, and is routed to the flux-tunable bus $B_1$ by applying a switch control signal to the switch $S_2$ of the control block 610-1 to connect the input terminal of the switch $S_2$ to the first output terminal (+) thereof, and thereby couple the I output of the DAC circuit (DAC1) to the flux-tunable bus $B_1$ (through an associated signal combiner and signal chain).

Moreover, the switches $S_1$, $S_2$, $S_3$, and $S_4$ of the control block 610-1 are concurrently controlled to allow qubit control signals RF_Q (which are generated by the DAC circuit (DAC1)) to be applied to the data qubit $D_1$ before and after the controlled entanglement operation. In particular, as shown in FIG. 6B, this is performed by applying a switch control signal to the switch $S_1$ to connect the input terminal of the switch $S_1$ to the first output terminal (+) thereof, and applying switch control signals to the switches $S_2$. $S_3$. and Sa to connect the input terminals of the switches $S_2$, $S_4$, and $S_4$ to the respective second output terminals (−) thereof. In this switching state of the switches $S_1$, $S_2$, $S_3$, and $S_4$, the I/Q signal outputs of the DAC circuit (DAC1) are applied to the I/Q mixer to generate and apply a qubit control signal RF_Q to the data qubit $D_1$.

Next, in the fourth stage 634 of the Z-stabilizer measurement 630, a Z-basis measurement 613 is performed on the flag qubit $F_3$. This is performed by applying switch control signals to the switches $S_5$ and $S_6$ of the control block 620-1 to connect the input terminals of the switches $S_5$ and $S_6$ to the respective first output terminals (+) thereof, and thereby connect the I/Q outputs of the DAC circuit (DAC2) to an I/Q mixer to generate and apply a qubit readout control signal RF_RO to the flag qubit $F_3$ (through an associated signal combiner and signal chain).

Figures 7A, 7B:
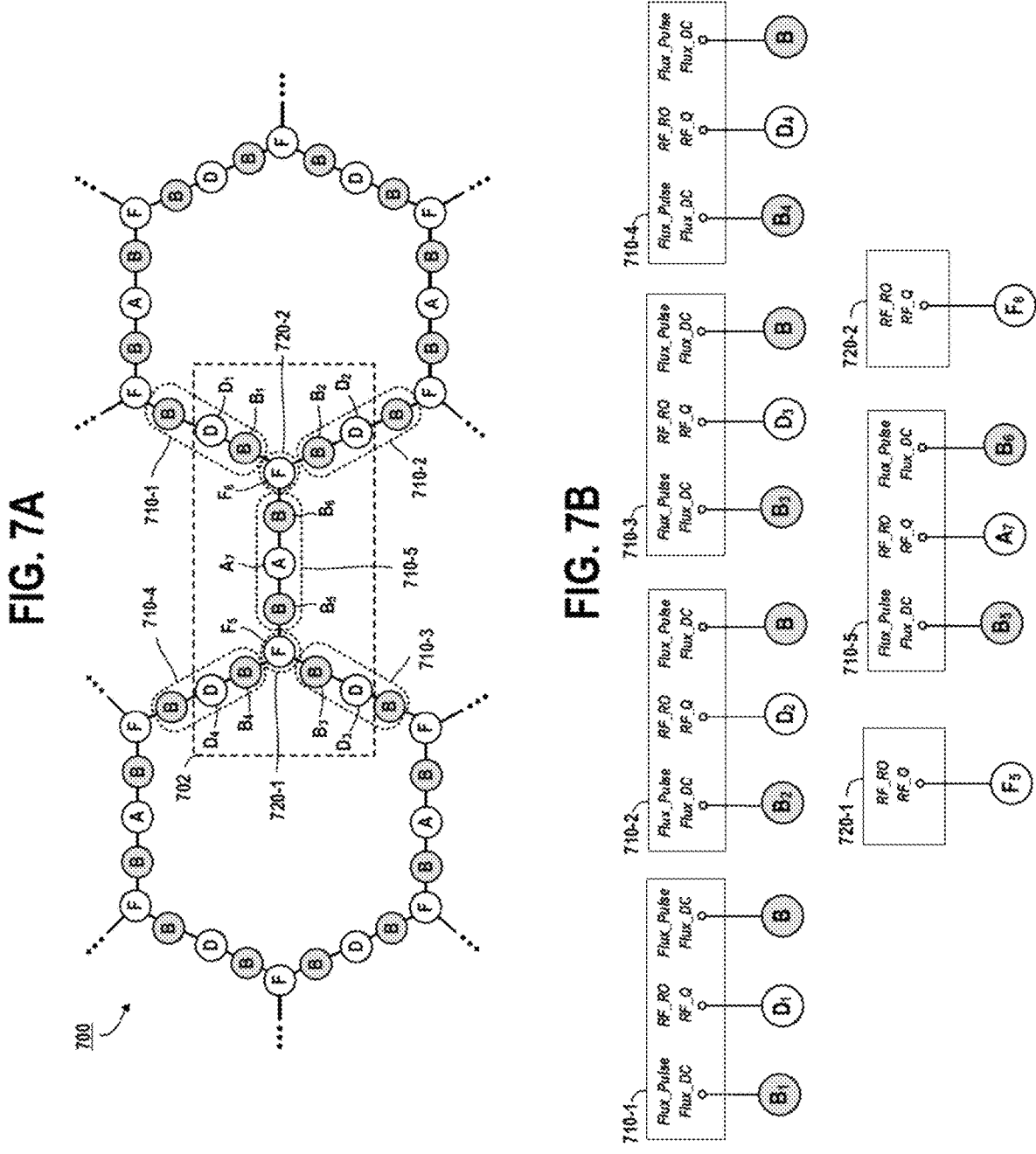
FIGS. 7A, 7B, and 7C schematically illustrate a process of performing an X-stabilizer measurement for a quantum error correction code of a heavy hexagonal qubit lattice using a time-domain multiplexing control system, according to an exemplary embodiment of the disclosure.
Figure 7C:
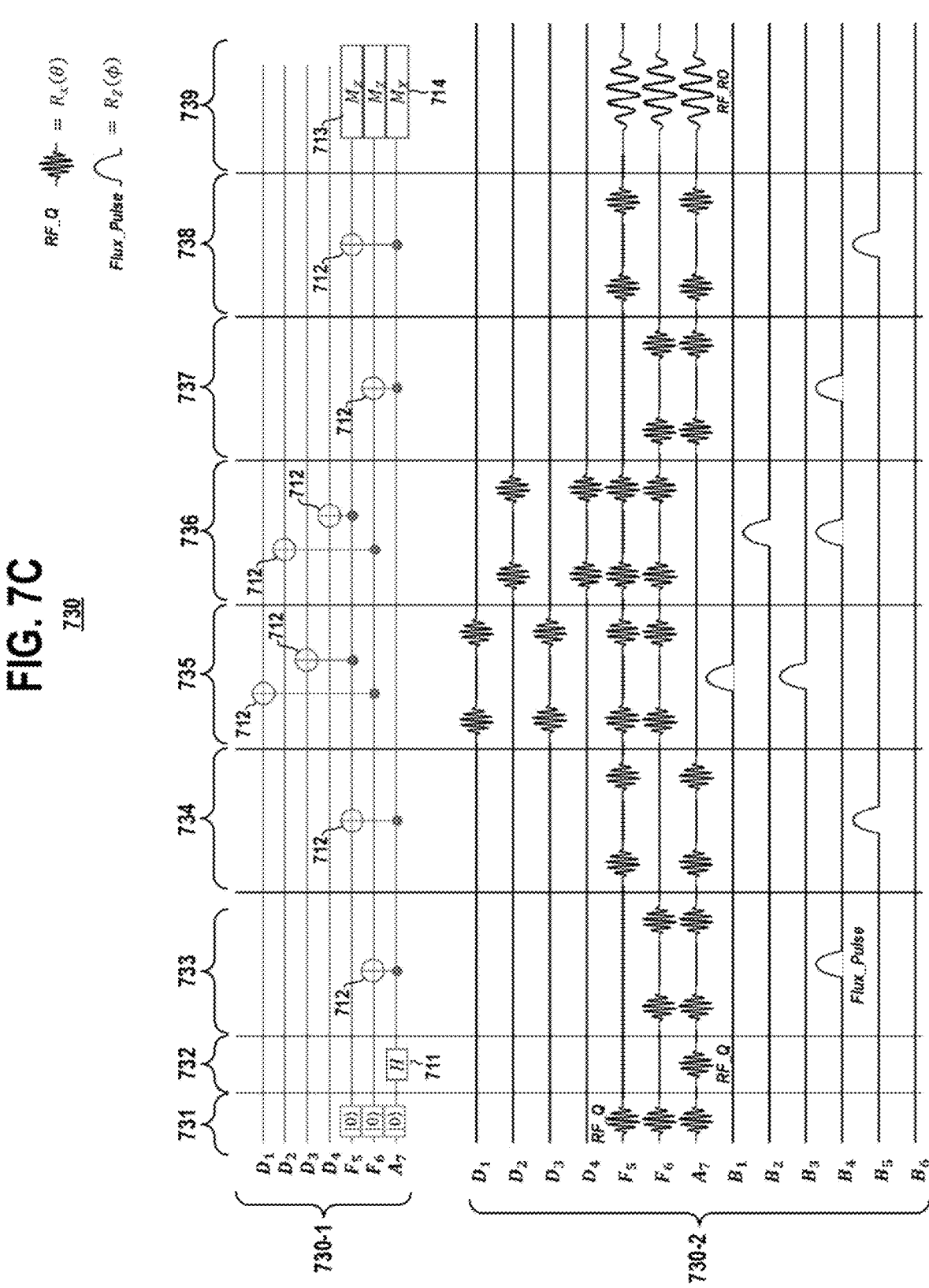

Next, FIGS. 7A, 7B, and 7C schematically illustrate a process of performing an X-stabilizer measurement (e.g., X-type parity check) for a quantum error correction code of a heavy hexagonal qubit lattice using a time-domain multiplexing control system, according to an exemplary embodiment of the disclosure. In particular, FIG. 7A schematically illustrates two unit hexagonal cells of a heavy hexagonal qubit lattice 700 and a quantum error correction code (e.g., surface code) comprising ax X-stabilizer surface code 702. The X-stabilizer surface code 702 comprises a group of qubits which include data qubits $D_1$, $D_2$, $D_3$, and $D_4$, flag qubits $F_5$ and $F_6$, and ancilla qubit $A_7$, which are coupled together by flux-tunable busses $B_1$, $B_2$, $B_3$, $B_4$ $B_5$, and $B_6$ (e.g., transmon qubit couplers).

FIGS. 7A and 7B schematically illustrate a plurality of control blocks 710-1, 710-2, 710-3, 710-4, 710-5, 720-1, and 720-2 which are coupled to qubits within the X-stabilizer surface code 702. More specifically, the control block 710-1 is coupled to the data qubit $D_1$ and the flux-tunable bus $B_1$ (and another flux-tunable bus B that is not part of the X-stabilizer surface code 702). The control block 710-2 is coupled to the data qubit $D_2$ and the flux-tunable bus $B_2$ (and another flux-tunable bus B that is not part of the X-stabilizer surface code 702). The control block 710-3 is coupled to the data qubit $D_3$ and the flux-tunable bus $B_3$ (and another flux-tunable bus B that is not part of the X-stabilizer surface code 702). The control block 710-4 is coupled to the data qubit $D_4$ and the flux-tunable bus $B_4$ (and another flux-tunable bus B that is not part of the X-stabilizer surface code 702). The control block 710-5 is coupled to the ancilla qubit $A_7$ and the flux-tunable busses $B_5$ and $B_6$. The control block 720-1 is coupled to the flag qubit $F_5$, and the control block 720-2 is coupled to the flag qubit $F_6$. In some embodiments, each control block 710-1, 710-2, 710-3, 710-4, and 710-5 is similar in circuit architecture to the first control block 210 of FIG. 2, and each control block 720-1 and 720-2 is similar in circuit architecture to the second control block 220 of FIG. 2. In this regard, each control block 710-1, 710-2, 710-3, 710-4, 710-5, 720-1, and 720-2 is comprises a single DAC circuit and multiple switches to enable time-domain multiplexing and routing of control signals, as discussed above.

Next, FIG. 7C schematically illustrates an X-stabilizer measurement 730 that is performed on the X-stabilizer surface code 702 using the time-domain multiplexing control circuitry shown in FIG. 7B, according to an exemplary embodiment of the disclosure. In particular, FIG. 7C illustrates a quantum circuit 730-1 for the X-stabilizer measurement 730, as well as a timing diagram 730-2 which shows the qubit control signals (RF_Q) and the readout control signals (RF_RO) which are generated to control the qubits $D_1$, $D_2$, $D_3$, and $D_4$, the flag qubits $F_5$ and $F_6$, and the ancilla qubit $A_7$, as well as the flux pulse control signals (Flux_Pulse) that control the flux-tunable busses $B_1$, $B_2$, $B_3$, $B_4$ $B_5$, and $B_6$. For case of illustration, FIG. 7C does not specifically show the timing of the switch control signals that are applied to control the operating states of the various switches of the control blocks 710-1, 710-2, 710-3, 710-4, 710-5, 720-1, and 720-2, to provide time-domain multiplexing of the qubit control and readout signals and the flux pulse control signals shown in FIG. 7C, although it is to be understood that the same or similar switching states of the switches of the control blocks are the same or similar to the switching states shown in FIG. 6B for the same types of control blocks, the details of which need not be repeated.

FIG. 7C depicts sequential stages 731, 732, 733, 734, 735, 736, 737, 738, 739 and 730 that are performed for the X-stabilizer measurement 730. In the first stage 731 of the X-stabilizer measurement 730, the states of the flag qubits $F_5$ and $F_6$ and ancilla qubit $A_7$ are reset/initialized into the ground state $|0\rangle$ by the control blocks 720-1, 720-2, and 710-5 generating and applying respective qubit control signals RF_Q to the flag qubits $F_5$ and $F_6$ and ancilla qubit $A_7$. In the second stage 732 of the X-stabilizer measurement 730, a Hadamard gate 711 is applied to the ancilla qubit $A_7$ by the control block 710-5 generating and generating and applying a qubit control signal RF_Q to the ancilla qubit $A_7$ to perform the Hadamard operation.

Next, a plurality of CNOT operations are applied during stages 733-738 of the X-stabilizer measurement 730. In particular, in the third stage 733, a CNOT gate 712 is applied between the ancilla qubit $A_7$ (control) and the flag qubit $F_6$ (target). In the fourth stage 734, a CNOT gate 712 is applied between the ancilla qubit $A_7$ (control) and the flag qubit $F_5$ (target). In the fifth stage 735, two CNOT operations are concurrently performed, i.e., a first CNOT gate 712 is applied between the flag qubit $F_6$ (control) and the data qubit $D_1$ (target), and a second CNOT gate 712 is applied between the flag qubit $F_5$ (control) and the data qubit $D_3$ (target). Similarly, in the sixth stage 736, two CNOT operations are concurrently performed, i.e., a first CNOT gate 712 is applied between the flag qubit $F_6$ (control) and the data qubit $D_2$ (target), and a second CNOT gate 712 is applied between the flag qubit $F_5$ (control) and the data qubit $D_4$ (target). In the seventh stage 737, a CNOT gate 712 is applied between the ancilla qubit $A_7$ (control) and the flag qubit $F_6$ (target). In the eighth stage 738, a CNOT gate 712 is applied between the ancilla qubit $A_7$ (control) and the flag qubit $F_5$ (target). It is to be noted that the CNOT gate operations are performed using the same or similar operations as discussed in detail above for the CNOT gate operations shown in FIG. 6B, the details of which need not be repeated.

In the ninth stage 739 of the X-stabilizer measurement 730, Z-basis measurements 713 are performed on each of the flag qubits $F_5$ and $F_6$, and an X-basis measurement 714 is performed on the ancilla qubit $A_7$. The measurements are performed by the control blocks 720-1, 720-2, and 710-5 generating and applying respective qubit readout control signals RF_RO to the auxiliary qubits $F_5$, $F_6$, and $A_7$. As noted above, the X-basis measurement 714 is performed in the ninth stage 739 by applying a Hadamard gate 711 to the ancilla qubit $A_7$ followed by performing a Z-basis measurement of the ancilla qubit $A_7$ wherein, as noted above, the sequence of H and $M_Z$ is equivalent to $M_X$.

Figure 8:
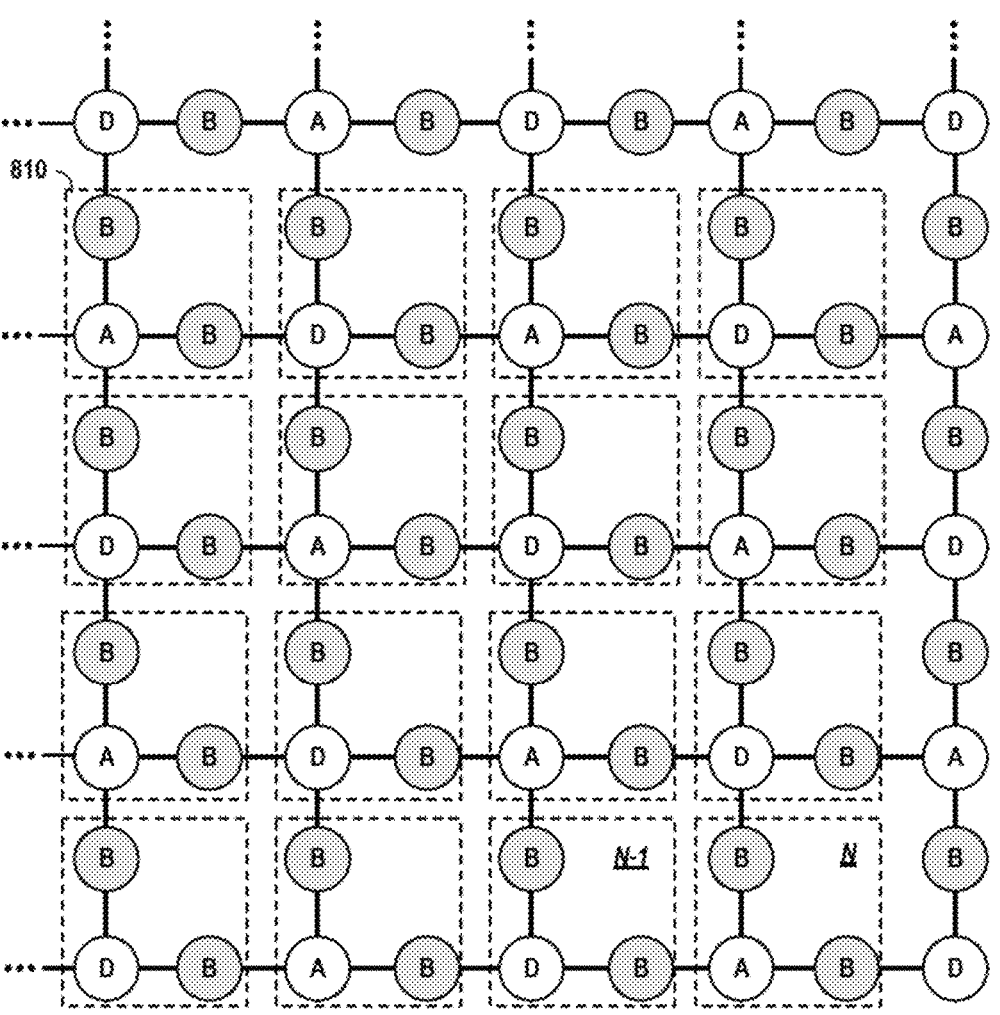
FIG. 8 schematically illustrates a square qubit lattice with a flux-tunable bus architecture, which can be controlled using a time-domain multiplexing control signal architecture, according to an exemplary embodiment of the disclosure.

In other embodiments, the exemplary time-domain multiplexing control circuits and techniques as discussed above can be applied to control the operation of a square qubit lattice. For example, FIG. 8 schematically illustrates a square qubit lattice with a flux-tunable bus architecture, which can be controlled using a time-domain multiplexing control signal architecture, according to an exemplary embodiment of the disclosure. In particular, FIG. 8 schematically illustrates a square qubit lattice 800 which comprises an array of data qubits (denoted D), flux-tunable busses (denoted B), and auxiliary qubits comprising ancilla qubits (denoted A). A square lattice topology such as shown in FIG. 8 can be used to implement a superconducting quantum processor architecture having a square qubit lattice with surface codes (e.g., X and Z stabilizer codes) to enable quantum error correction.

As generally shown in FIG. 8, the square qubit lattice 800 comprises a plurality (N) of square unit cells, where each square unit cell of the lattice comprises a square arrangement of qubits, where a qubit (e.g., data qubit (D) or ancilla qubit (A) is located at each vertex of each unit cell, and a flux-tunable bus (B) is located on each edge of each unit cell. In this exemplary configuration, the data qubits (D) and ancilla qubits (A) are alternately arranged on a two-dimensional grid, wherein each ancilla qubit (A) is surrounded by four data qubits(S) which form a stabilizer, except for boundaries. In addition, each qubit (data qubit (D) and ancilla qubit (A)) has four adjacent flux-tunable busses (B) wherein, at any given time, only one of the four flux-tunable busses (B) will be active.

In this regard, the exemplary first control block 210 shown in FIG. 2, which provides time-domain multiplexing of a qubit control signals (RF_Q), readout control signals (RF_RO), and flux pulse control signals (Flux_Pulse) using a single DAC circuit and switching circuitry, can be utilized as a control basis for the square qubit lattice 800. For example, FIG. 8 schematically illustrates a plurality of control blocks 810, which are shown as dashed-line squares which each include one qubit (e.g., data qubit (D) or ancilla qubit (A)) and two flux-tunable busses (B). In some embodiments, each control block 810 comprises a circuit architecture which is the same or similar to the first control block 210 (FIG. 2) to enable multiplexing of qubit control and readout signals and flux pulse control signals for controlling two flux-tunable couplers and one qubit.

Figure 9A:
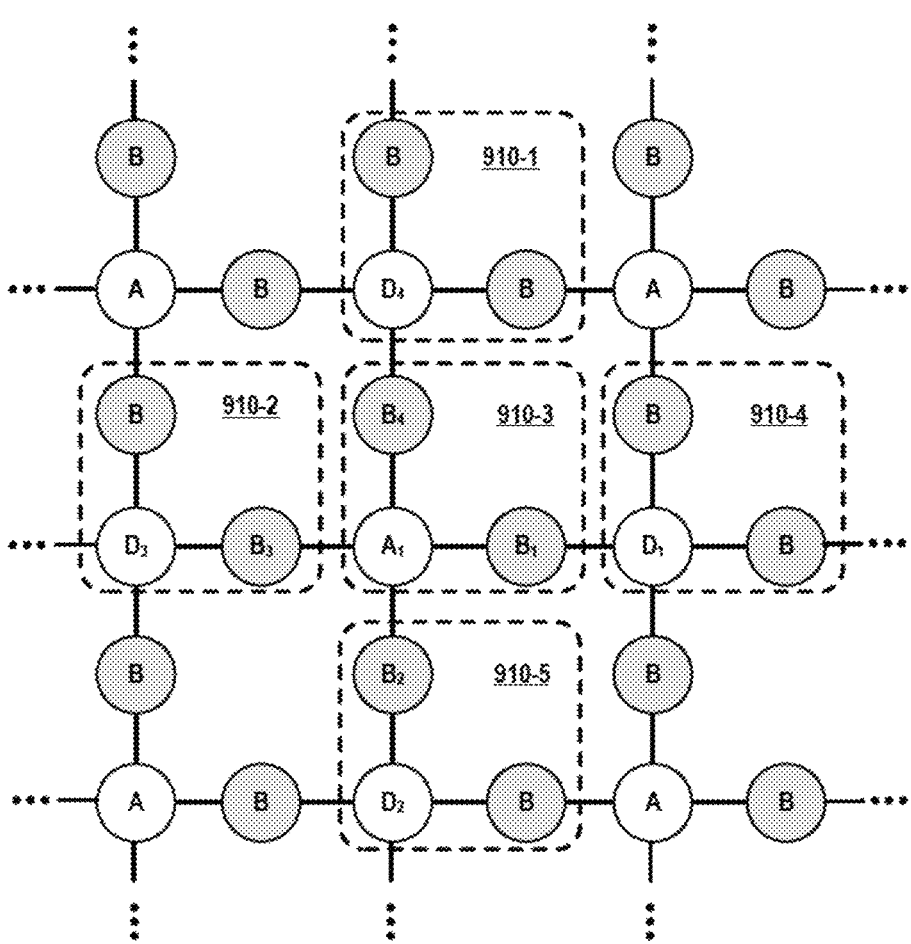
FIGS. 9A, 9B, 9C, and 9D schematically illustrate a process of performing a stabilizer measurement for a quantum error correction code of a square qubit lattice using a time-domain multiplexing control system, according to an exemplary embodiment of the disclosure.
Figure 9A:
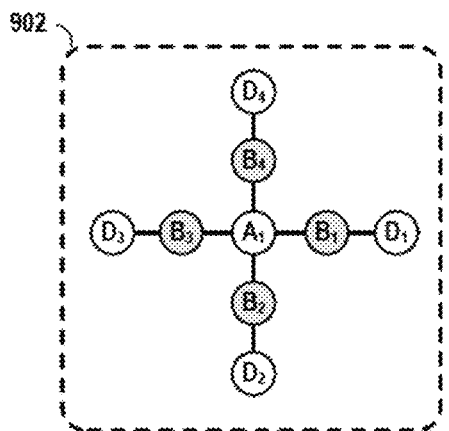

Next, FIGS. 9A, 9B, 9C, and 9D schematically illustrate a process of performing a stabilizer measurement for a quantum error correction code of a square qubit lattice using a time-domain multiplexing control system, according to an exemplary embodiment of the disclosure. In particular, FIG. 9A schematically illustrates a portion of a square qubit lattice 900 and an exemplary quantum error correction code 902 which comprise an X-stabilizer code or a Z-stabilizer code. The exemplary quantum error correction code 902 comprises an ancilla qubit $A_1$ and four data qubits $D_1$, $D_2$, $D_3$, and $D_4$ which surround, and are adjacent to the ancilla qubit $A_1$, and which interact through flux-tunable busses $B_1$, $B_2$, $B_3$, and $B_4$ (e.g., transmon qubit couplers).

Figure 9B:
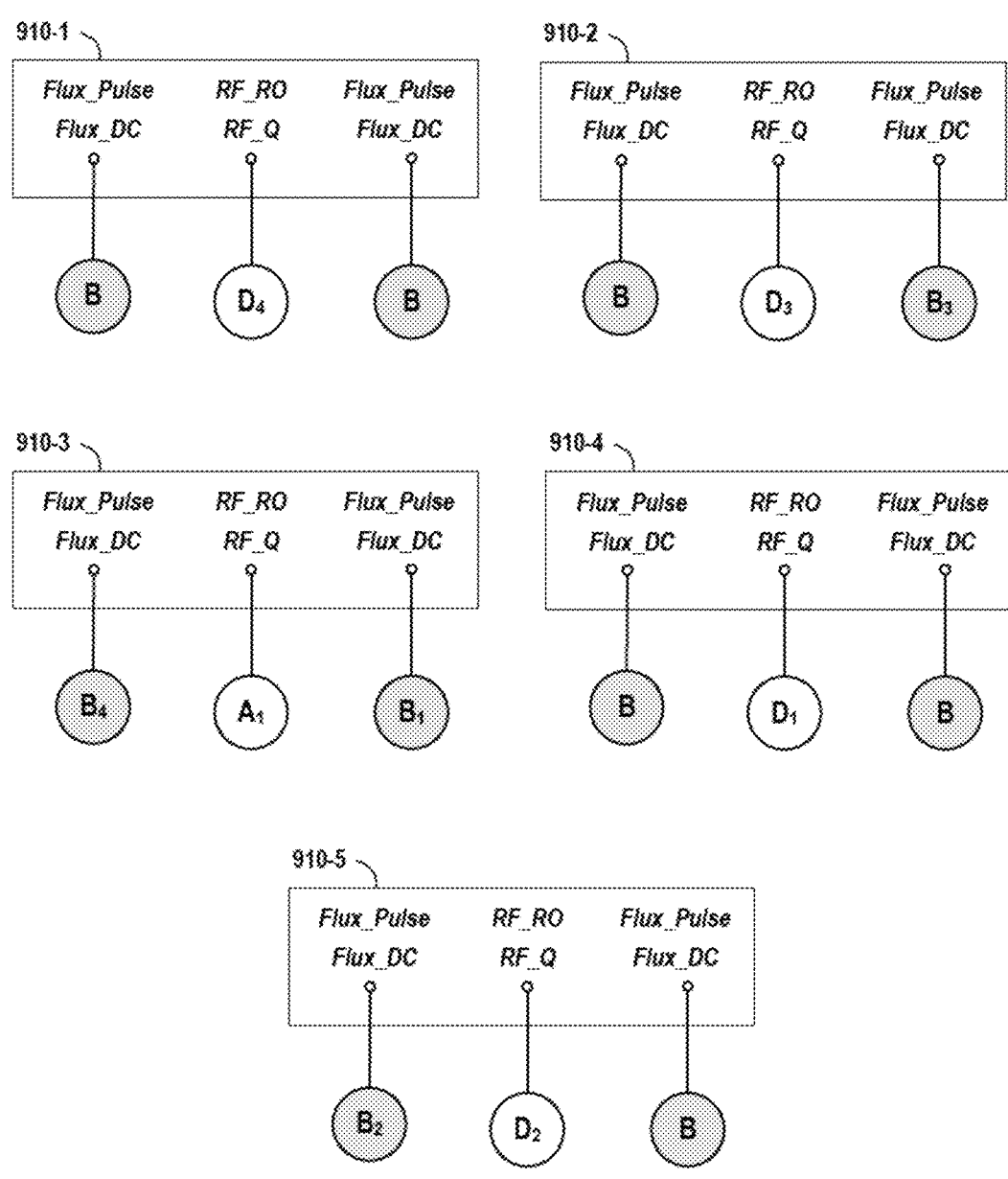

FIGS. 9A and 9B schematically illustrate a plurality of control blocks 910-1, 910-2, 910-3, 910-4, and 910-5 that are coupled to the qubits (ancilla qubit $A_1$ and data qubits $D_1$, $D_2$, $D_3$, and $D_4$) and the flux-tunable busses $B_1$, $B_2$, $B_3$, and $B_4$, which correspond to the exemplary quantum error correction code 902. More specifically, the control block 910-1 is coupled to the data qubit $D_4$ (and other flux-tunable buses B that is not part of the quantum error correction code 902). The control block 910-2 is coupled to the data qubit $D_3$ and the flux-tunable bus $B_3$ (and another flux-tunable bus B that is not part of the quantum error correction code 902). The control block 910-3 is coupled to the ancilla qubit $A_1$ and the flux-tunable busses $B_1$ and $B_4$. The control block 910-4 is coupled to the data qubit $D_1$ (and flux-tunable busses B that are not part of the quantum error correction code 902). The control block 910-5 is coupled to the data qubit $D_2$ and the flux-tunable bus $B_2$ (and another flux-tunable bus B that is not part of the quantum error correction code 902).

Figure 9C:
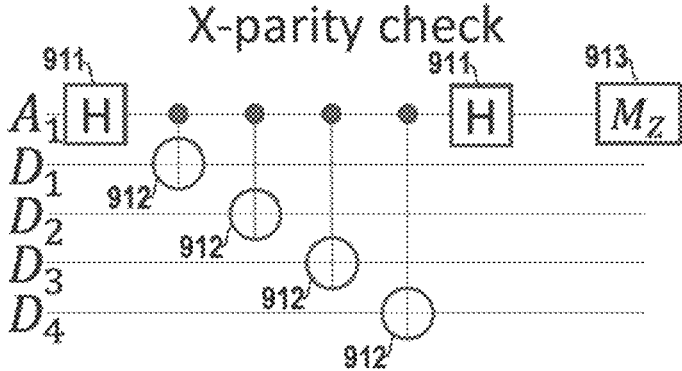

The quantum error correction code 902 shown in FIG. 9A represents either an X-stabilizer code or a Z-stabilizer code in the exemplary square qubit lattice 900. For example, FIG. 9C illustrates a quantum circuit which comprises a X-stabilizer circuit 920 that is configured to analyze the quantum error correction code 902 for an X-syndrome measurement. More specifically, FIG. 9C schematically illustrates a quantum circuit for performing an X-parity check for the quantum error correction code 902, which comprises Hadamard gates 911, and CNOT gates 912. As discussed above, the last Hadamard gate 911 and Z-basis measurement 913 that is applied to the ancilla qubit $A_1$ is equivalent to an X-basis measurement of the ancilla qubit $A_1$. FIG. 9C illustrates a sequence of CNOT gates 912 that are applied between the ancilla qubit $A_1$ (as the control qubit) and each of the data qubits $D_1$, $D_2$, $D_3$, and $D_4$ (as the target qubits).

Figure 9D:
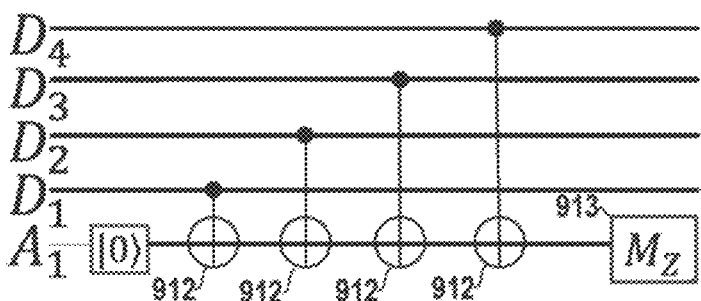

Next, FIG. 9D illustrates a quantum circuit which comprises a Z-stabilizer circuit 930 that is configured to analyze the quantum error correction code 902 for a Z-syndrome measurement. In particular, FIG. 9D schematically illustrates a quantum circuit for performing a Z-parity check for the quantum error correction code 902, which comprises CNOT gates 912, and a Z-basis measurement 913 that is applied to the ancilla qubit $A_1$. FIG. 9D illustrates a sequence of CNOT gates 912 that are applied between the ancilla qubit $A_1$ (as the target qubit) and each of the data qubits $D_1$, $D_2$, $D_3$, and $D_4$ (as the control qubits). It is to be noted that the control blocks 910-1, 910-2, 910-3, 910-4, and 910-5 shown in FIG. 9B operate to provide time-domain multiplexing of the qubit control signals (RF_Q), readout control signals (RF_RO), and flux pulse control signals (Flux_Pulse) that are needed to perform the X and Z syndrome measurements as shown in FIGS. 9C and 9D using the same or similar control protocols as discussed above, the details of which need not be repeated.

As noted above, in some embodiments, the filters 214-1, 214-2, 214-3, 214-4, and 224-1, and 224-2 of the first and second control blocks 210 and 220 (as shown in FIG. 2) comprise low-pass filters that are utilized to filter the I and Q output signals of the DAC circuits 211 and 221. In some embodiments, the DAC circuits 211 and 211 and the filters 214-1, 214-2, 214-3, 214-4, 224-1, and 224-2 are implemented using a current mode architecture, wherein the I and Q output signals of the DAC circuits 211 and 221 are current signals, and wherein the filters 214-1, 214-2, 214-3, 214-4, 224-1, and 224-2 each comprises a current series filter which is configured to filter the I and Q current signals output from the DAC circuits.

Figure 10A:
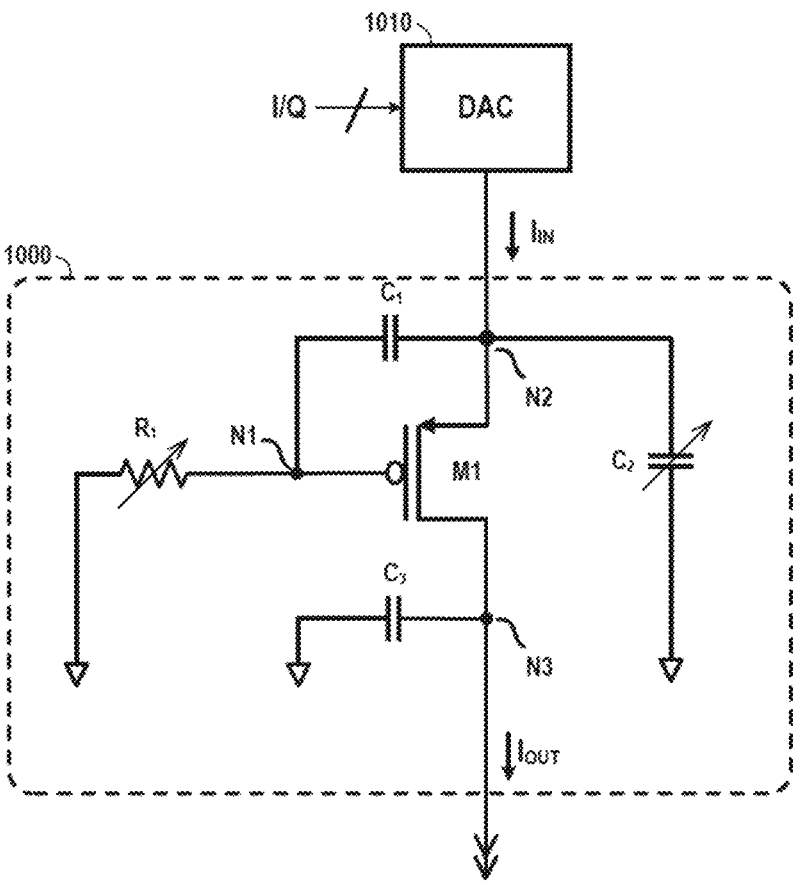
FIG. 10A schematically illustrates a current-mode low-pass filter circuit, according to an exemplary embodiment of the disclosure.

For example, FIG. 10A schematically illustrates a current-mode filter circuit according to an exemplary embodiment of the disclosure. In particular, FIG. 10A schematically illustrates a current-mode low-pass filter 1000 having an input port coupled to an output port of a DAC circuit 1010, and an output port that is coupled to, e.g., an input of an I/Q mixer, or a signal path that is coupled to a flux bias line of a flux-tunable bus, etc. The current-mode low-pass filter 1000 receives an input current $I_{IN}$ from the DAC circuit 1010, and outputs a low-pass filtered signal $I_{OUT}$ with a unitary gain. The current-mode low-pass filter 1000 is disposed on-chip and can be implemented for some or all of the low-pass filter components of the time-domain multiplexing control circuitry, e.g., first and second control blocks 210 and 220 as shown in FIG. 2.

The current-mode low-pass filter 1000 comprises a transistor M1 (e.g., PMOS transistor), a resistor $R_1$, a first capacitor $C_1$, a second capacitor $C_2$, and a third capacitor $C_3$. The transistor M1 comprises a gate terminal coupled to a first node N1, a source terminal coupled to a second node N2, and a drain terminal coupled to a third node N3. The resistor $R_1$ is coupled to and between the first node N1 and a ground node. The first capacitor $C_1$ is coupled to and between the first and second nodes N1 and N2. The second capacitor $C_2$ is coupled to and between the second node N2 and the ground node. The third capacitor $C_3$ is coupled to and between the third node N3 and the ground node. In some embodiments, the resistor $R_1$ is configured to have a variable resistance, and the second capacitor $C_2$ is configured to have a variable capacitance, wherein the variable resistance of $R_1$ and the variable capacitance of $C_2$ can each be tuned using digital control signals, to digitally configure a frequency response of the current-mode low-pass filter 1000.

As shown in FIG. 10A, the current-mode low-pass filter 1000 implements an RC network to drive the gate of the transistor M1. The current-mode low-pass filter 1000 comprises a single transistor architecture (only implements M1), to implement an analog low-pass filter which provides a unity gain, biquadratic transfer function response, and which has a relatively small on-chip footprint. In addition, the current-mode low-pass filter 1000 provides low input impedance and high output impedance, which is desirable for the given application. The current-mode low-pass filter 1000 provides robust operation in both room temperature environments and cryogenic temperature environments. The current-mode low-pass filter 1000 shares the DAC currents with no additional power consumption, and provides low distortion performance. Moreover, the current-mode filter design readily allows the muxing of inputs/outputs, e.g., the addition and/or subtraction of muxed current signals is facilitated by the current-mode filter design.

Figure 10B:
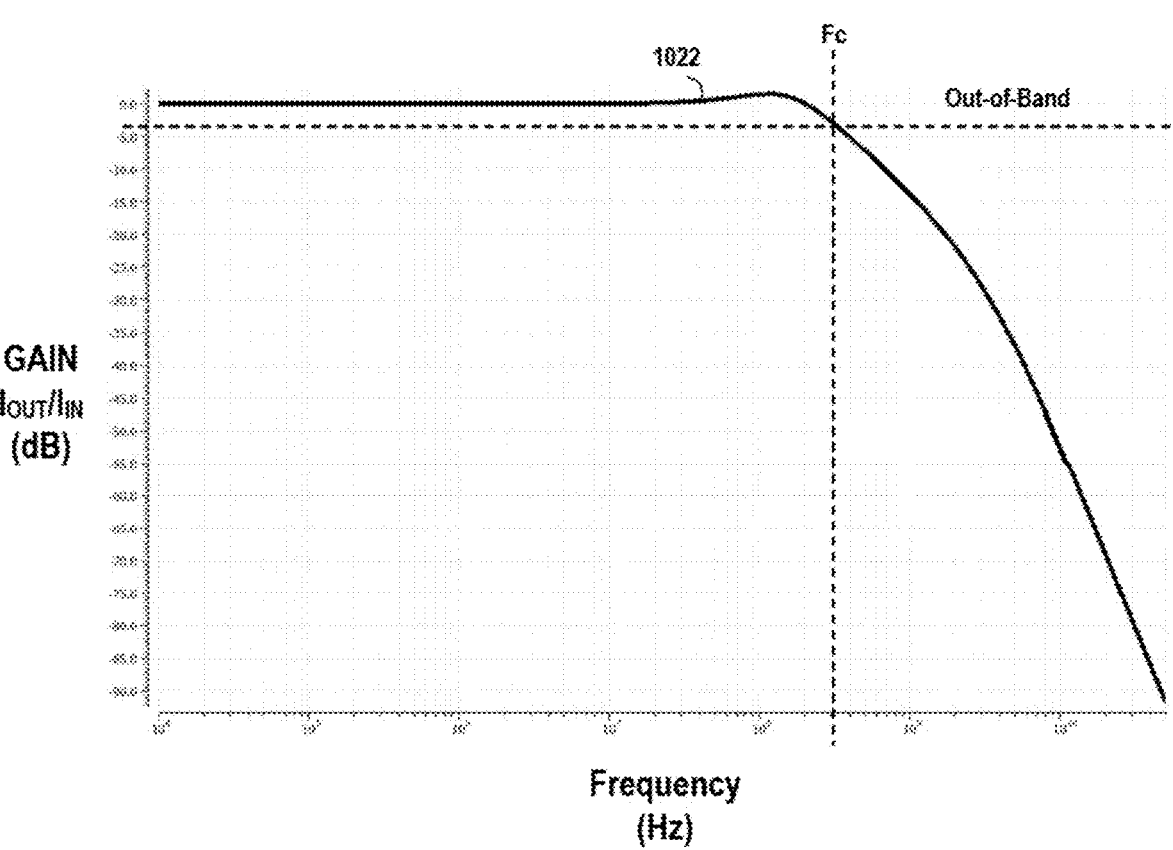
FIG. 10B graphically illustrates simulated response of a current-mode low-pass filter circuit, according to an exemplary embodiment of the disclosure.

FIG. 10B graphically illustrates simulated response of a current-mode low-pass filter circuit, according to an exemplary embodiment of the disclosure. In particular, FIG. 10B is a graph 1020 current gain (dB) (y-axis) as function of frequency (x-axis), which shows a simulated filter response curve 1022 of the exemplary current-mode low-pass filter (FIG. 10A) with unitary gain. The simulated filter response curve 1022 has a cutoff frequency Fc (at a −3 dB point), and is shown to have a sharp frequency response over a wide frequency range and exhibit good out-of-band rejection, which is highly desirable.

Figure 11:
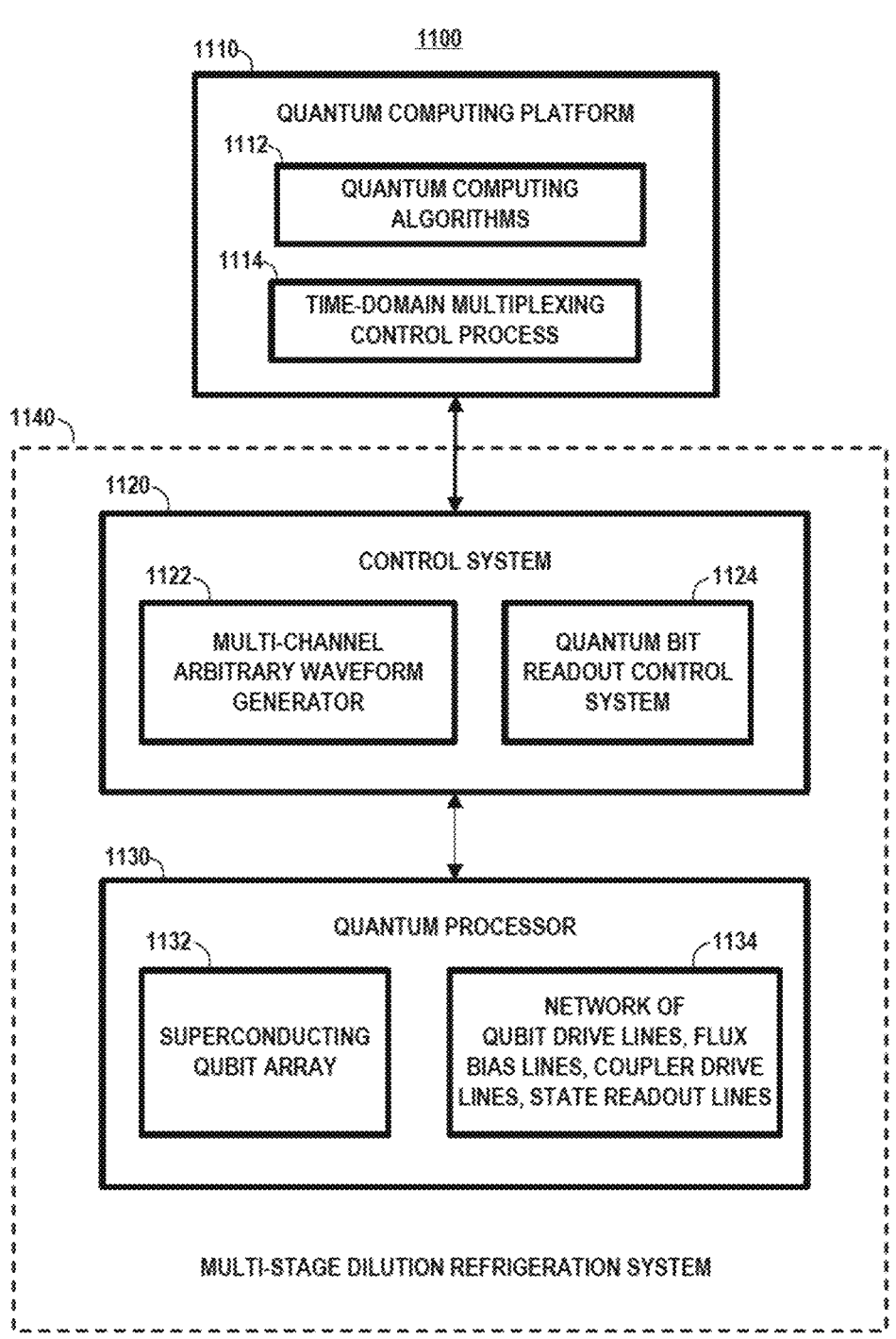
FIG. 11 schematically illustrates a quantum computing system, according to an exemplary embodiment of the disclosure.

FIG. 11 schematically illustrates a quantum computing system, according to an exemplary embodiment of the disclosure. In particular, FIG. 11 schematically illustrates a quantum computing system 1100 which comprises a quantum computing platform 1110, a control system 1120, and a quantum processor 1130. In some embodiments, the quantum computing platform 1110 implements software control programs to perform quantum computing algorithms 1112 (e.g., software-based quantum error correction operations as discussed herein) and software-controlled processes such as time-domain multiplexing control processes 1114 which implement time-domain multiplexing control protocols to generate switch control signals to control the switching circuitry of the control signal generation system/circuitry (e.g., as shown in FIG. 2) to enable multiplexing of qubit control signals, as needed, when executing quantum algorithms such as syndrome measurements for quantum error correction (e.g., as shown in FIGS. 6B, 7B, etc.)

In addition, in some embodiments, the control system 1120 comprises a multi-channel arbitrary waveform generator 1122, and a quantum bit readout control system 1124. The quantum processor 1130 comprises at least one quantum chip having a superconducting qubit array 1132 and a network 1134 of qubit drive lines, coupler flux-bias control lines, and qubit state readout lines, and other circuit QED components that may be needed for a given application or quantum system configuration. In some embodiments, the superconducting qubit array 1132 comprises a quantum system comprising an array of superconducting data qubits, superconducting auxiliary qubits, and superconducting flux-tunable couplers, arranged in a heavy hexagonal qubit lattice topology (e.g., FIG. 3) or square lattice topology (e.g., FIG. 8), as described above.

In some embodiments, the control system 1120 and the quantum processor 1130 are disposed in a dilution refrigeration system 1140 which can generate cryogenic temperatures that are sufficient to operate components of the control system 1120 for quantum computing applications. For example, the quantum processor 1130 may need to be cooled down to near-absolute zero, e.g., 10-15 millikelvin (mK), to allow the superconducting qubits to exhibit quantum behaviors. In some embodiments, the dilution refrigeration system 1140 comprises a multi-stage dilution refrigerator where the components of the control system 1120 can be maintained at different cryogenic temperatures, as needed. For example, while the quantum processor 1130 may need to be cooled down to, e.g., 20 mK or below (e.g., 10-15 mK) the circuit components of the control system 1120 may be operated at cryogenic temperatures greater than 10-15 mK (e.g., cryogenic temperatures in a range of 3K-4K), depending on the configuration of the quantum computing system. In other embodiments, some or all of components of the multi-channel arbitrary waveform generator 1122 and/or quantum bit readout control system 1124 can be implemented in a room temperature environment, while the signal chains (for control signal input, and read signal output) extend from a room temperature environment through different temperature stages (e.g., five temperature stages: 20 millikelvin (mK), 100 mK. 1K, 3-4K, 40K) of the dilution refrigeration system 1140.

The network 1134 of qubit drive lines, coupler flux bias control lines, and qubit state readout lines, etc., is coupled to the control system 1120 through a suitable hardware input/output (I/O) interface, which couples I/O signals between the control system 1120 and the quantum processor 1130. For example, the hardware I/O interface may comprise various types of hardware and components, such as RF cables, wiring, RF elements, optical fibers, heat exchanges, filters, amplifiers, isolators, etc.

The quantum computing platform 1110 comprises a software and hardware platform which comprises various software layers that are configured to perform various functions, including, but not limited to, generating and implementing various quantum applications using suitable quantum programming languages, configuring and implementing various quantum gate operations, compiling quantum programs into a quantum assembly language, implementing and utilizing a suitable quantum instruction set architecture (ISA), performing calibration operations to calibrate the quantum circuit elements and gate operations, etc. In addition, the quantum computing platform 1110 comprises a hardware architecture of processors, memory, etc., which is configured to control the execution of quantum applications, and interface with the control system 1120 to (i) generate digital control signals that are converted to analog microwave control signals by the control system 1120, to control operations of the quantum processor 1130 when executing a given quantum application, and (ii) to obtain and process digital signals received from the control system 1120, which represent the processing results generated by the quantum processor 1130 when executing various gate operations for a given quantum application.

The quantum computing platform 1110 comprises a software and hardware platform which comprises various software layers that are configured to perform various functions, including, but not limited to, generating and implementing various quantum applications using suitable quantum programming languages, configuring and implementing various quantum gate operations, compiling quantum programs into a quantum assembly language, implementing and utilizing a suitable quantum instruction set architecture (ISA), performing calibration operations to calibrate the quantum circuit elements and gate operations, etc. In addition, the quantum computing platform 1110 comprises a hardware architecture of processors, memory, etc., which is configured to control the execution of quantum applications, and interface with the control system 1120 to (i) generate digital control signals that are converted to analog microwave control signals by the control system 1120, to control operations of the quantum processor 1130 when executing a given quantum application, and (ii) to obtain and process digital signals received from the control system 1120, which represent the processing results generated by the quantum processor 1130 when executing various gate operations for a given quantum application. In some exemplary embodiments, the quantum computing platform 1110 of the quantum computing system 1100 may be implemented using any suitable computing system architecture (e.g., as shown in FIG. 12) which is configured to implement methods to support quantum computing operations by executing computer readable program instructions that are embodied on a computer program product which includes a computer readable storage medium (or media) having such computer readable program instructions thereon for causing a processor to perform control methods as discussed herein.

Various aspects of the present disclosure are described by narrative text, flowcharts, block diagrams of computer systems and/or block diagrams of the machine logic included in computer program product (CPP) embodiments. With respect to any flowcharts, depending upon the technology involved, the operations can be performed in a different order than what is shown in a given flowchart. For example, again depending upon the technology involved, two operations shown in successive flowchart blocks may be performed in reverse order, as a single integrated step, concurrently, or in a manner at least partially overlapping in time.

A computer program product embodiment ("CPP embodiment" or "CPP") is a term used in the present disclosure to describe any set of one, or more, storage media (also called "mediums") collectively included in a set of one, or more, storage devices that collectively include machine readable code corresponding to instructions and/or data for performing computer operations specified in a given CPP claim. A "storage device" is any tangible device that can retain and store instructions for use by a computer processor. Without limitation, the computer readable storage medium may be an electronic storage medium, a magnetic storage medium, an optical storage medium, an electromagnetic storage medium, a semiconductor storage medium, a mechanical storage medium, or any suitable combination of the foregoing. Some known types of storage devices that include these mediums include: diskette, hard disk, random access memory (RAM), read-only memory (ROM), erasable programmable read-only memory (EPROM or Flash memory), static random-access memory (SRAM), compact disc read-only memory (CD-ROM), digital versatile disk (DVD), memory stick, floppy disk, mechanically encoded device (such as punch cards or pits/lands formed in a major surface of a disc) or any suitable combination of the foregoing. A computer readable storage medium, as that term is used in the present disclosure, is not to be construed as storage in the form of transitory signals per se, such as radio waves or other freely propagating electromagnetic waves, electromagnetic waves propagating through a waveguide, light pulses passing through a fiber optic cable, electrical signals communicated through a wire, and/or other transmission media. As will be understood by those of skill in the art, data is typically moved at some occasional points in time during normal operations of a storage device, such as during access, de-fragmentation or garbage collection, but this does not render the storage device as transitory because the data is not transitory while it is stored.

Figure 12:
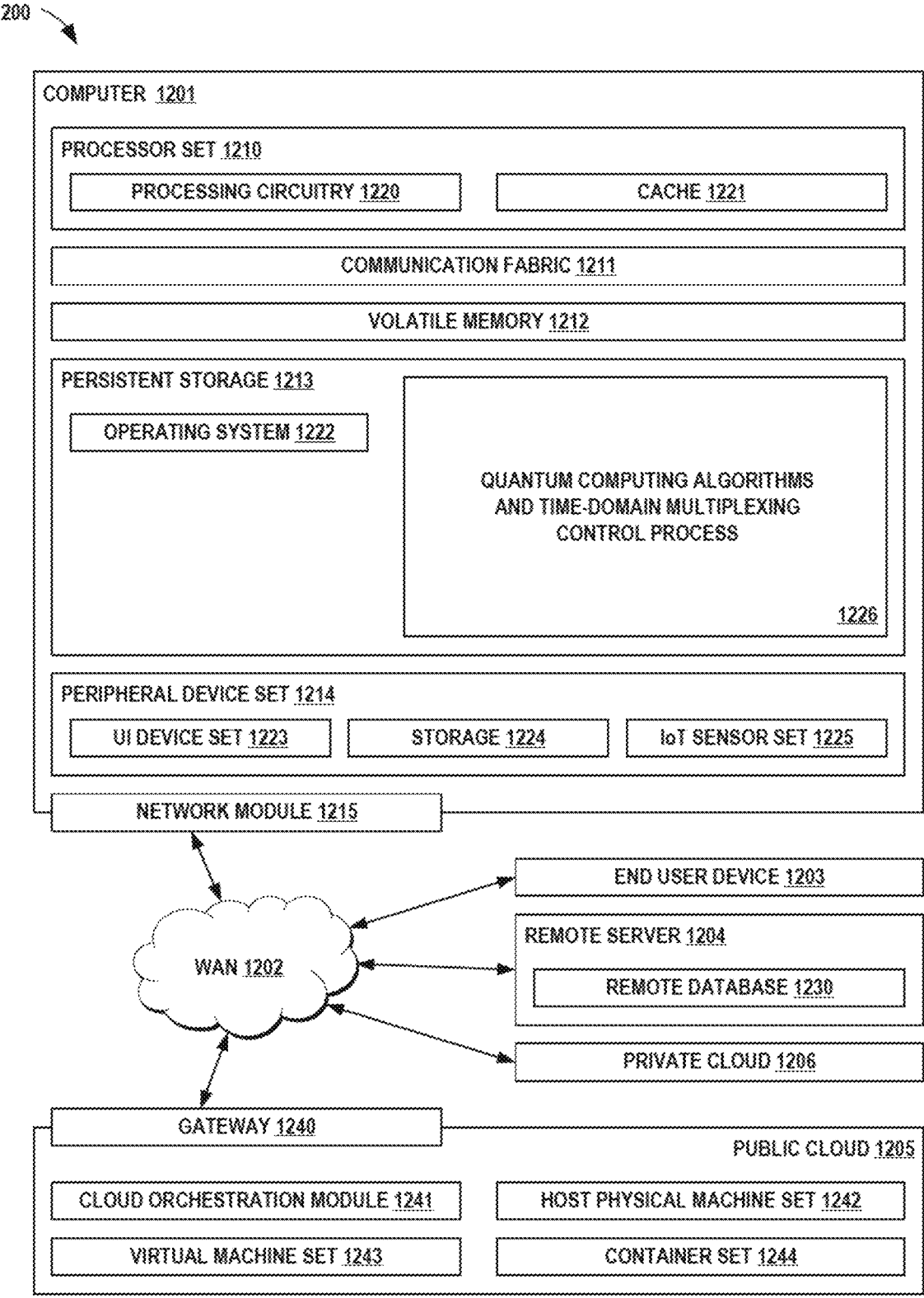
FIG. 12 schematically illustrates an exemplary architecture of a computing environment for hosting a quantum computing platform and performing quantum information processing, according to an exemplary embodiment of the disclosure.

Computing environment 1200 of FIG. 12 contains an example of an environment for the execution of at least some of the computer code involved in performing the inventive methods, such as program code for performing quantum computing algorithms (e.g., syndrome measurements and decoding for quantum error correction algorithms) and time-domain multiplexing control processes to generate switch control signals which control the switching circuitry of the control signal generation system/circuitry (e.g., as shown in FIG. 2) to enable multiplexing of qubit control signals, as needed, when executing the quantum algorithms (e.g., syndrome measurements for quantum error correction). In addition to block 1226, computing environment 1200 includes, for example, computer 1201, wide area network (WAN) 1202, end user device (EUD) 1203, remote server 1204, public cloud 1205, and private cloud 1206. In this embodiment, computer 1201 includes processor set 1210 (including processing circuitry 1220 and cache 1221), communication fabric 1211, volatile memory 1212, persistent storage 1213 (including operating system 1222 and block 1226, as identified above), peripheral device set 1214 (including user interface (UI), device set 1223, storage 1224, and Internet of Things (IoT) sensor set 1225), and network module 1215. Remote server 1204 includes remote database 1230. Public cloud 1205 includes gateway 1240, cloud orchestration module 1241, host physical machine set 1242, virtual machine set 1243, and container set 1244.

Computer 1201 may take the form of a desktop computer, laptop computer, tablet computer, smart phone, smart watch or other wearable computer, mainframe computer, quantum computer or any other form of computer or mobile device now known or to be developed in the future that is capable of running a program, accessing a network or querying a database, such as remote database 1230. As is well understood in the art of computer technology, and depending upon the technology, performance of a computer-implemented method may be distributed among multiple computers and/or between multiple locations. On the other hand, in this presentation of computing environment 1200, detailed discussion is focused on a single computer, specifically computer 1201, to keep the presentation as simple as possible. Computer 1201 may be located in a cloud, even though it is not shown in a cloud in FIG. 12. On the other hand, computer 1201 is not required to be in a cloud except to any extent as may be affirmatively indicated.

Processor set 1210 includes one, or more, computer processors of any type now known or to be developed in the future. Processing circuitry 1220 may be distributed over multiple packages, for example, multiple, coordinated integrated circuit chips. Processing circuitry 1220 may implement multiple processor threads and/or multiple processor cores. Cache 1221 is memory that is located in the processor chip package(s) and is typically used for data or code that should be available for rapid access by the threads or cores running on processor set 1210. Cache memories are typically organized into multiple levels depending upon relative proximity to the processing circuitry. Alternatively, some, or all, of the cache for the processor set may be located "off chip." In some computing environments, processor set 1210 may be designed for working with qubits and performing quantum computing.

Computer readable program instructions are typically loaded onto computer 1201 to cause a series of operational steps to be performed by processor set 1210 of computer 1201 and thereby effect a computer-implemented method, such that the instructions thus executed will instantiate the methods specified in flowcharts and/or narrative descriptions of computer-implemented methods included in this document (collectively referred to as "the inventive methods"). These computer readable program instructions are stored in various types of computer readable storage media, such as cache 1221 and the other storage media discussed below. The program instructions, and associated data, are accessed by processor set 1210 to control and direct performance of the inventive methods. In computing environment 1200, at least some of the instructions for performing the inventive methods may be stored in block 1226 in persistent storage 1213.

Communication fabric 1211 is the signal conduction paths that allow the various components of computer 1201 to communicate with each other. Typically, this fabric is made of switches and electrically conductive paths, such as the switches and electrically conductive paths that make up busses, bridges, physical input/output ports and the like. Other types of signal communication paths may be used, such as fiber optic communication paths and/or wireless communication paths.

Volatile memory 1212 is any type of volatile memory now known or to be developed in the future. Examples include dynamic type random access memory (RAM) or static type RAM. Typically, the volatile memory is characterized by random access, but this is not required unless affirmatively indicated. In computer 1201, the volatile memory 1212 is located in a single package and is internal to computer 1201, but, alternatively or additionally, the volatile memory may be distributed over multiple packages and/or located externally with respect to computer 1201.

Persistent storage 1213 is any form of non-volatile storage for computers that is now known or to be developed in the future. The non-volatility of this storage means that the stored data is maintained regardless of whether power is being supplied to computer 1201 and/or directly to persistent storage 1213. Persistent storage 1213 may be a read only memory (ROM), but typically at least a portion of the persistent storage allows writing of data, deletion of data and re-writing of data. Some familiar forms of persistent storage include magnetic disks and solid-state storage devices. Operating system 1222 may take several forms, such as various known proprietary operating systems or open source Portable Operating System Interface type operating systems that employ a kernel. The code included in block 1226 typically includes at least some of the computer code involved in performing the inventive methods.

Peripheral device set 1214 includes the set of peripheral devices of computer 1201. Data communication connections between the peripheral devices and the other components of computer 1201 may be implemented in various ways, such as Bluetooth connections, Near-Field Communication (NFC) connections, connections made by cables (such as universal serial bus (USB) type cables), insertion type connections (for example, secure digital (SD) card), connections made though local area communication networks and even connections made through wide area networks such as the internet. In various embodiments, UI device set 1223 may include components such as a display screen, speaker, microphone, wearable devices (such as goggles and smart watches), keyboard, mouse, printer, touchpad, game controllers, and haptic devices. Storage 1224 is external storage, such as an external hard drive, or insertable storage, such as an SD card. Storage 1224 may be persistent and/or volatile. In some embodiments, storage 1224 may take the form of a quantum computing storage device for storing data in the form of qubits. In embodiments where computer 1201 is required to have a large amount of storage (for example, where computer 1201 locally stores and manages a large database) then this storage may be provided by peripheral storage devices designed for storing very large amounts of data, such as a storage area network (SAN) that is shared by multiple, geographically distributed computers. IoT sensor set 1225 is made up of sensors that can be used in Internet of Things applications. For example, one sensor may be a thermometer and another sensor may be a motion detector.

Network module 1215 is the collection of computer software, hardware, and firmware that allows computer 1201 to communicate with other computers through WAN 1202. Network module 1215 may include hardware, such as modems or Wi-Fi signal transceivers, software for packetizing and/or de-packetizing data for communication network transmission, and/or web browser software for communicating data over the internet. In some embodiments, network control functions and network forwarding functions of network module 1215 are performed on the same physical hardware device. In other embodiments (for example, embodiments that utilize software-defined networking (SDN)), the control functions and the forwarding functions of network module 1215 are performed on physically separate devices, such that the control functions manage several different network hardware devices. Computer readable program instructions for performing the inventive methods can typically be downloaded to computer 1201 from an external computer or external storage device through a network adapter card or network interface included in network module 1215.

WAN 1202 is any wide area network (for example, the internet) capable of communicating computer data over non-local distances by any technology for communicating computer data, now known or to be developed in the future. In some embodiments, the WAN may be replaced and/or supplemented by local area networks (LANs) designed to communicate data between devices located in a local area, such as a Wi-Fi network. The WAN and/or LANs typically include computer hardware such as copper transmission cables, optical transmission fibers, wireless transmission, routers, firewalls, switches, gateway computers and edge servers.

End user device (EUD) 1203 is any computer system that is used and controlled by an end user (for example, a customer of an enterprise that operates computer 1201), and may take any of the forms discussed above in connection with computer 1201. EUD 1203 typically receives helpful and useful data from the operations of computer 1201. For example, in a hypothetical case where computer 1201 is designed to provide a recommendation to an end user, this recommendation would typically be communicated from network module 1215 of computer 1201 through WAN 1202 to EUD 1203. In this way, EUD 1203 can display, or otherwise present, the recommendation to an end user. In some embodiments, EUD 1203 may be a client device, such as thin client, heavy client, mainframe computer, desktop computer and so on.

Remote server 1204 is any computer system that serves at least some data and/or functionality to computer 1201. Remote server 1204 may be controlled and used by the same entity that operates computer 1201. Remote server 1204 represents the machine(s) that collect and store helpful and useful data for use by other computers, such as computer 1201. For example, in a hypothetical case where computer 1201 is designed and programmed to provide a recommendation based on historical data, then this historical data may be provided to computer 1201 from remote database 1230 of remote server 1204.

Public cloud 1205 is any computer system available for use by multiple entities that provides on-demand availability of computer system resources and/or other computer capabilities, especially data storage (cloud storage) and computing power, without direct active management by the user. Cloud computing typically leverages sharing of resources to achieve coherence and economies of scale. The direct and active management of the computing resources of public cloud 1205 is performed by the computer hardware and/or software of cloud orchestration module 1241. The computing resources provided by public cloud 1205 are typically implemented by virtual computing environments that run on various computers making up the computers of host physical machine set 1242, which is the universe of physical computers in and/or available to public cloud 1205. The virtual computing environments (VCEs) typically take the form of virtual machines from virtual machine set 1243 and/or containers from container set 1244. It is understood that these VCEs may be stored as images and may be transferred among and between the various physical machine hosts, either as images or after instantiation of the VCE. Cloud orchestration module 1241 manages the transfer and storage of images, deploys new instantiations of VCEs and manages active instantiations of VCE deployments. Gateway 1240 is the collection of computer software, hardware, and firmware that allows public cloud 1205 to communicate through WAN 1202.

Some further explanation of virtualized computing environments (VCEs) will now be provided. VCEs can be stored as "images." A new active instance of the VCE can be instantiated from the image. Two familiar types of VCEs are virtual machines and containers. A container is a VCE that uses operating-system-level virtualization. This refers to an operating system feature in which the kernel allows the existence of multiple isolated user-space instances, called containers. These isolated user-space instances typically behave as real computers from the point of view of programs running in them. A computer program running on an ordinary operating system can utilize all resources of that computer, such as connected devices, files and folders, network shares, CPU power, and quantifiable hardware capabilities. However, programs running inside a container can only use the contents of the container and devices assigned to the container, a feature which is known as containerization.

Private cloud 1206 is similar to public cloud 1205, except that the computing resources are only available for use by a single enterprise. While private cloud 1206 is depicted as being in communication with WAN 1202, in other embodiments a private cloud may be disconnected from the internet entirely and only accessible through a local/private network. A hybrid cloud is a composition of multiple clouds of different types (for example, private, community or public cloud types), often respectively implemented by different vendors. Each of the multiple clouds remains a separate and discrete entity, but the larger hybrid cloud architecture is bound together by standardized or proprietary technology that enables orchestration, management, and/or data/application portability between the multiple constituent clouds. In this embodiment, public cloud 1205 and private cloud 1206 are both part of a larger hybrid cloud.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A device, comprising:
a control circuit configured to control a plurality of quantum bits, wherein the control circuit comprises:
a digital-to-analog converter circuit; and
switching circuitry coupled to an output of the digital-to-analog converter circuit, wherein the switching circuitry is responsive to switch control signals to selectively connect the output of the digital-to-analog converter circuit to one of a plurality of signal paths to generate control signals at different times to control the plurality of quantum bits, wherein:
at one time, the digital-to-analog converter circuit outputs a first pulse that is applied by operation of the switching circuitry to a first signal path to generate a first radio frequency (RF) control pulse which is applied to a first superconducting quantum bit to control a state of the first superconducting quantum bit; and
at another time, the digital-to-analog converter circuit outputs a second pulse that is applied by operation of the switching circuitry to a second signal path to generate a flux control pulse which is applied to a coupler circuit to cause entanglement between the first superconducting quantum bit and a second superconducting quantum bit.

2. The device of claim 1, wherein the switch control signals are generated based on a time-domain multiplexing control protocol.

3. The device of claim 1, wherein the control circuit further comprises:
a first mixer circuit coupled to the switching circuitry; and
a second mixer circuit coupled to the switching circuitry;
wherein the digital-to-analog converter circuit is configured to generate a first type of pulse signal which is utilized by the first mixer circuit to generate the first RF control pulse to control the state of the first superconducting quantum bit, and to generate a second type of pulse signal which is utilized by the second mixer circuit to generate a second RF control pulse to readout a state of the first superconducting quantum bit; and
wherein the switching circuitry is configured to selectively couple the output of the digital-to-analog converter circuit to one of (i) an input of the first mixer circuit when the first type of pulse signal is to be applied to the first mixer circuit to generate the first RF control pulse, and (ii) an input of the second mixer circuit when the second type of pulse signal is to be applied to the second mixer circuit to generate the second RF control pulse.

4. The device of claim 3, wherein:
the digital-to-analog converter circuit is configured to generate a third type of pulse signal as the second pulse that is output from the digital-to-analog converter circuit and applied by operation of the switching circuitry to the second signal path to generate the flux control pulse which is applied to the coupler circuit.

5. The device of claim 1, wherein the control circuit further comprises a current-mode filter which is configured to filter a current signal that is output from the digital-to-analog converter circuit, wherein the current-mode filter comprises:
a transistor comprising a first terminal coupled to an input node of the current-mode filter, and a second terminal coupled to an output node of the current-mode filter;
a resistor coupled to and between a gate terminal of the transistor and a ground node;
a first capacitor coupled to and between the input node and the gate terminal of the transistor;
a second capacitor coupled to and between the input node and the ground node; and
a third capacitor coupled to and between the output node of the current-mode filter and the ground node;
wherein the current-mode filter shares current consumption with the digital-to-analog converter circuit.

6. The device of claim 5, wherein the current-mode filter comprises a low-pass filter with a unity gain, biquadratic transfer function.

7. The device of claim 5, wherein:
the resistor is configured to have a variable resistance;
the second capacitor is configured to have a variable capacitance; and
the variable resistance and the variable capacitance are configured to be digitally controlled to configure a frequency response of the current-mode filter.

8. A device, comprising:
a control circuit configured to control a quantum bit array comprising quantum bits and flux-tunable couplers which control exchange interactions between adjacent quantum bits in the quantum bit array, wherein the control circuit comprises at least one instance of a first control block which is configured to generate control signals to control a first flux-tunable coupler, a second flux-tunable coupler, and a quantum bit that is disposed between the first flux-tunable coupler and the second flux-tunable coupler in the quantum bit array;
wherein the at least one instance of the first control block comprises:
a digital-to-analog converter circuit; and
switching circuitry coupled to an output of the digital-to-analog converter circuit, wherein the switching circuitry is responsive to switch control signals to selectively couple the output of the digital-to-analog converter circuit to a first signal path at one time to generate and apply a flux control pulse to one of the first flux-tunable coupler and the second flux-tunable coupler, and another signal path at another time to generate and apply a radio frequency (RF) control pulse to the quantum bit.

9. The device of claim 8, wherein the switch control signals are generated based on a time-domain multiplexing control protocol.

10. The device of claim 8, wherein the at least one instance of the first control block further comprises:

a first mixer circuit coupled to the switching circuitry; and a second mixer circuit coupled to the switching circuitry;

wherein the digital-to-analog converter circuit is configured to:

generate a first type of pulse signal which is utilized by the first mixer circuit to generate a first RF control pulse to control a state of the quantum bit;

generate a second type of pulse signal which is utilized by the second mixer circuit to generate a second RF control pulse to readout a state of the quantum bit; and generate a third type of pulse signal which utilized to control operation of the first flux-tunable coupler and the second flux-tunable coupler;

wherein the switching circuitry is configured to selectively couple the output of the digital-to-analog converter circuit to one of:

an input of the first mixer circuit when the first type of pulse signal is to be applied to the first mixer circuit to generate the first RF control pulse;

an input of the second mixer circuit when the second type of pulse signal is to be applied to the second mixer circuit to generate the second RF control pulse; and the first signal path which is coupled to the first flux-tunable coupler or a second signal path which is coupled to the second flux-tunable coupler, when the third type of pulse signal is utilized to generate and apply the flux control pulse to the first flux-tunable coupler or the second flux-tunable coupler.

11. The device of claim 8, wherein the control circuit further comprises at least one instance of a second control block which is configured to generate control signals to control a single another quantum bit in the quantum bit array;

wherein the at least one instance of the second control block comprises:

a second digital-to-analog converter circuit; and switching circuitry coupled to an output of the second digital-to-analog converter circuit, wherein the switching circuitry is responsive to switch control signals to selectively couple the output of the second digital-to-analog converter circuit to a given RF signal path, at a given time, to generate one of (i) a first RF control pulse to control a state of the other quantum bit and (ii) a second RF control pulse to readout a state of the other quantum bit, at the given time.

12. The device of claim 8, wherein the at least one instance of the first control block further comprises a current-mode filter which is configured to filter a current signal that is output from the digital-to-analog converter circuit, wherein the current-mode filter comprises:

a transistor comprising a first terminal coupled to an input node of the current-mode filter, and a second terminal coupled to an output node of the current-mode filter;

a resistor coupled to and between a gate terminal of the transistor and a ground node;

a first capacitor coupled to and between the input node and the gate terminal of the transistor;

a second capacitor coupled to and between the input node and the ground node; and a third capacitor coupled to and between the output node of the current-mode filter and the ground node;

wherein the current-mode filter shares current consumption with the digital-to-analog converter circuit.

13. The device of claim 12, wherein the current-mode filter comprises a low-pass filter with a unity gain, biquadratic transfer function.

14. The device of claim 12, wherein:

the resistor is configured to have a variable resistance;

the second capacitor is configured to have a variable capacitance; and the variable resistance and the variable capacitance are configured to be digitally controlled to configure a frequency response of the current-mode filter.

15. A system, comprising:

a quantum processor comprising a quantum bit array which comprises quantum bits and flux-tunable couplers that are configured to control exchange interactions between adjacent quantum bits in the quantum bit array; and a control system comprising a control circuit which is configured to generate control signals to control the quantum processor, wherein the control circuit comprises at least one instance of a first control block which is configured to generate control signals to control a first flux-tunable coupler, a second flux-tunable coupler, and a quantum bit that is disposed between the first flux-tunable coupler and the second flux-tunable coupler in the quantum bit array;

wherein the at least one instance of the first control block comprises:

a digital-to-analog converter circuit; and switching circuitry coupled to an output of the digital-to-analog converter circuit, wherein the switching circuitry is responsive to switch control signals to selectively couple the output of the digital-to-analog converter circuit to a first signal path at one time to generate and apply a flux control pulse to one of the first flux-tunable coupler and the second flux-tunable coupler, and another signal path at another time to generate and apply a radio frequency (RF) control pulse to the quantum bit.

16. The system of claim 15, wherein the control system is configured to generate and apply the switch control signals based on a time-domain multiplexing control protocol.

17. The system of claim 15, wherein the at least one instance of the first control block further comprises:

a first mixer circuit coupled to the switching circuitry; and a second mixer circuit coupled to the switching circuitry;

wherein the digital-to-analog converter circuit is configured to:

generate a first type of pulse signal which is utilized by the first mixer circuit to generate a first RF control pulse to control a state of the quantum bit;

generate a second type of pulse signal which is utilized by the second mixer circuit to generate a second RF control pulse to readout a state of the quantum bit; and generate a third type of pulse signal which utilized to control operation of the first flux-tunable coupler and the second flux-tunable coupler;

wherein the switching circuitry is configured to selectively couple the output of the digital-to-analog converter circuit to one of:

an input of the first mixer circuit when the first type of pulse signal is to be applied to the first mixer circuit to generate the first RF control pulse;

an input of the second mixer circuit when the second type of pulse signal is to be applied to the second mixer circuit to generate the second RE control pulse; and the first signal path which is coupled to the first flux-tunable coupler or a second signal path which is coupled to the second flux-tunable coupler, when the third type of pulse signal is utilized to generate and apply the flux control pulse to the first flux-tunable coupler or the second flux-tunable coupler.

18. The system of claim 15, wherein the control circuit further comprises at least one instance of a second control block which is configured to generate control signals to control another quantum bit in the quantum bit array;

wherein the at least one instance of the second control block comprises:

a second digital-to-analog converter circuit; and switching circuitry coupled to an output of the second digital-to-analog converter circuit, wherein the switching circuitry is responsive to switch control signals to selectively couple the output of the second digital-to-analog converter circuit to a given RF signal path, at a given time, to generate one of (i) a first RF control pulse to control a state of the other quantum bit and (ii) a second RE control pulse to readout a state of the other quantum bit, at the given time.

19. The system of claim 15, wherein the at least one instance of the first control block further comprises a current-mode filter which is configured to filter a current signal that is output from the digital-to-analog converter circuit, wherein the current-mode filter comprises:

a transistor comprising a first terminal coupled to an input node of the current-mode filter, and a second terminal coupled to an output node of the current-mode filter;

a resistor coupled to and between a gate terminal of the transistor and a ground node;

a first capacitor coupled to and between the input node and the gate terminal of the transistor;

a second capacitor coupled to and between the input node and the ground node; and a third capacitor coupled to and between the output node of the current-mode filter and the ground node;

wherein the current-mode filter shares current consumption with the digital-to-analog converter circuit.

20. The system of claim 19, wherein:

the quantum bit array comprises one of a heavy hexagonal lattice topology and a square lattice topology;

the quantum bits comprise data quantum bits and auxiliary quantum bits, wherein each data quantum bit is coupled to at least two adjacent auxiliary quantum bits by flux-tunable couplers in the quantum bit array; and the control system is configured to generate control signals to perform syndrome measurements for quantum error correction.

* * * * *